US009260778B2

(12) United States Patent
Chang et al.

(10) Patent No.: US 9,260,778 B2
(45) Date of Patent: Feb. 16, 2016

(54) ORGANIC LAYER DEPOSITION APPARATUS, METHOD OF MANUFACTURING ORGANIC LIGHT-EMITTING DISPLAY APPARATUS USING THE SAME, AND ORGANIC LIGHT-EMITTING DISPLAY APPARATUS MANUFACTURED USING THE METHOD

(71) Applicant: Samsung Display Co. Ltd., Yongin-si, Gyeonggi-do (KR)

(72) Inventors: Yun-Ho Chang, Yongin-si (KR); Tae-Yong Kim, Yongin-si (KR); Mi-Joo Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 112 days.

(21) Appl. No.: 13/654,378

(22) Filed: Oct. 17, 2012

(65) Prior Publication Data

US 2013/0341598 A1 Dec. 26, 2013

(30) Foreign Application Priority Data

Jun. 22, 2012 (KR) .................. 10-2012-0067303

(51) Int. Cl.
*H01J 9/00* (2006.01)
*C23C 14/12* (2006.01)
(Continued)

(52) U.S. Cl.
CPC .............. *C23C 14/12* (2013.01); *C23C 14/50* (2013.01); *H01L 21/6776* (2013.01); *H01L 21/67173* (2013.01); *H01L 21/67709* (2013.01); *H01L 21/6831* (2013.01); *H01L 51/56* (2013.01);

(Continued)

(58) Field of Classification Search
CPC .. C23C 14/12; C23C 14/50; H01L 21/67173; H01L 21/67709; H01L 21/6776; H01L 51/001
USPC ....................................... 445/23–25
See application file for complete search history.

(56) References Cited

U.S. PATENT DOCUMENTS

| 4,416,217 | A | 11/1983 | Nakamura et al. |
| 6,274,198 | B1 | 8/2001 | Dautartas |

(Continued)

FOREIGN PATENT DOCUMENTS

| CN | 1556872 A | 12/2004 |
| CN | 1607868 A | 4/2005 |

(Continued)

OTHER PUBLICATIONS

JPO Office action dated Mar. 19, 2013, for Japanese Patent application 2011-097909, (3 pages).

(Continued)

*Primary Examiner* — Andrew Coughlin
(74) *Attorney, Agent, or Firm* — Lewis Roca Rothgerber Christie LLP

(57) ABSTRACT

An organic layer deposition apparatus, a method of manufacturing an organic light-emitting display device by using the same, and an organic light-emitting display device manufactured using the method, and in particular, an organic layer deposition apparatus that is suitable for use in the mass production of a large substrate and enables high-definition patterning, a method of manufacturing an organic light-emitting display device by using the same, and an organic light-emitting display device manufactured using the method.

35 Claims, 10 Drawing Sheets

(51) Int. Cl.

| | | |
|---|---|---|
| *H01L 51/56* | (2006.01) | |
| *H01L 21/67* | (2006.01) | |
| *H01L 21/677* | (2006.01) | |
| *H01L 21/683* | (2006.01) | |
| *C23C 14/50* | (2006.01) | |
| *H01L 27/28* | (2006.01) | |
| *H01L 51/00* | (2006.01) | |

(52) U.S. Cl.
CPC .............. *H01L 27/28* (2013.01); *H01L 51/001* (2013.01); *H01L 2227/323* (2013.01)

(56) References Cited

U.S. PATENT DOCUMENTS

| | | | |
|---|---|---|---|
| 6,371,451 | B1 | 4/2002 | Choi |
| 6,417,034 | B2 | 7/2002 | Kitazume et al. |
| 6,589,673 | B1 | 7/2003 | Kido et al. |
| 6,699,324 | B1 | 3/2004 | Berdin et al. |
| 6,749,906 | B2 | 6/2004 | Van Slyke |
| RE39,024 | E | 3/2006 | Takahashi |
| 7,078,070 | B2 | 7/2006 | Peng |
| 2001/0006827 | A1 | 7/2001 | Yamazaki et al. |
| 2001/0034175 | A1 | 10/2001 | Miyazaki et al. |
| 2002/0011785 | A1 | 1/2002 | Tang et al. |
| 2002/0017245 | A1 | 2/2002 | Tsubaki et al. |
| 2002/0076847 | A1 | 6/2002 | Yamada et al. |
| 2002/0168577 | A1 | 11/2002 | Yoon |
| 2002/0179013 | A1 | 12/2002 | Kido et al. |
| 2003/0101937 | A1 | 6/2003 | Van Slyke et al. |
| 2003/0168013 | A1 | 9/2003 | Freeman et al. |
| 2003/0221614 | A1 | 12/2003 | Kang et al. |
| 2003/0221620 | A1 | 12/2003 | Yamazaki |
| 2003/0232563 | A1 | 12/2003 | Kamiyama et al. |
| 2004/0056244 | A1 | 3/2004 | Marcus et al. |
| 2004/0115338 | A1 | 6/2004 | Yoneda |
| 2004/0127066 | A1 | 7/2004 | Jung |
| 2004/0134428 | A1 | 7/2004 | Sasaki et al. |
| 2004/0142108 | A1 | 7/2004 | Atobe et al. |
| 2004/0144321 | A1 | 7/2004 | Grace et al. |
| 2004/0157167 | A1 | 8/2004 | Morii |
| 2004/0194702 | A1 | 10/2004 | Sasaki et al. |
| 2004/0255857 | A1 | 12/2004 | Chow et al. |
| 2005/0016461 | A1 | 1/2005 | Klug et al. |
| 2005/0031836 | A1 | 2/2005 | Hirai |
| 2005/0037136 | A1 | 2/2005 | Yamamoto |
| 2005/0072359 | A1 | 4/2005 | Kim |
| 2005/0166842 | A1 | 8/2005 | Sakamoto |
| 2005/0166844 | A1 | 8/2005 | Gralenski |
| 2005/0183670 | A1 | 8/2005 | Grantham et al. |
| 2005/0244580 | A1 | 11/2005 | Cok et al. |
| 2005/0263074 | A1 | 12/2005 | Masuda et al. |
| 2006/0040132 | A1 | 2/2006 | Liao et al. |
| 2006/0130766 | A1 | 6/2006 | Kim et al. |
| 2006/0144325 | A1 | 7/2006 | Jung et al. |
| 2006/0169211 | A1 | 8/2006 | Kim et al. |
| 2006/0174829 | A1 | 8/2006 | An et al. |
| 2006/0205101 | A1 | 9/2006 | Lee et al. |
| 2006/0269671 | A1 | 11/2006 | Kim et al. |
| 2007/0009552 | A1 | 1/2007 | Whitehead et al. |
| 2007/0015430 | A1* | 1/2007 | Nishio et al. .................. 445/24 |
| 2007/0017445 | A1* | 1/2007 | Takehara et al. ............. 118/719 |
| 2007/0077358 | A1 | 4/2007 | Jeong et al. |
| 2007/0178708 | A1 | 8/2007 | Ukigaya |
| 2008/0018236 | A1 | 1/2008 | Arai et al. |
| 2008/0115729 | A1 | 5/2008 | Oda et al. |
| 2008/0118743 | A1 | 5/2008 | Lee et al. |
| 2008/0131587 | A1 | 6/2008 | Boroson et al. |
| 2008/0216741 | A1 | 9/2008 | Ling et al. |
| 2009/0017192 | A1 | 1/2009 | Matsuura |
| 2009/0229524 | A1 | 9/2009 | Kim et al. |
| 2009/0232976 | A1 | 9/2009 | Yoon et al. |
| 2009/0279173 | A1 | 11/2009 | Chui et al. |

FOREIGN PATENT DOCUMENTS

| | | |
|---|---|---|
| CN | 1704501 A | 12/2005 |
| CN | 1814854 A | 8/2006 |
| EP | 1 413 644 A2 | 4/2004 |
| EP | 1 418 250 A2 | 5/2004 |
| EP | 1 518 940 A1 | 3/2005 |
| JP | 2-247372 | 10/1990 |
| JP | 04-272170 | 9/1992 |
| JP | 09-095776 | 4/1997 |
| JP | 10-050478 | 2/1998 |
| JP | 2000-068054 | 3/2000 |
| JP | 2001-052862 | 2/2001 |
| JP | 2001-093667 | 4/2001 |
| JP | 2002-175878 | 6/2002 |
| JP | 2002-348659 | 12/2002 |
| JP | 2003-003250 | 1/2003 |
| JP | 2003-077662 | 3/2003 |
| JP | 2003-157973 | 5/2003 |
| JP | 2003-297562 | 10/2003 |
| JP | 2004-043898 | 2/2004 |
| JP | 2004-076150 | 3/2004 |
| JP | 2004-103269 | 4/2004 |
| JP | 2004-103341 | 4/2004 |
| JP | 2004-137583 | 5/2004 |
| JP | 2004-143521 | 5/2004 |
| JP | 2004-199919 | 7/2004 |
| JP | 2004-349101 | 12/2004 |
| JP | 2005-044592 | 2/2005 |
| JP | 2005-235568 | 9/2005 |
| JP | 2005-293968 | 10/2005 |
| JP | 2005-296737 | 10/2005 |
| JP | 2006-275433 | 10/2006 |
| JP | 2007-047293 | 2/2007 |
| JP | 2007-146219 | 6/2007 |
| JP | 2008-121098 | 5/2008 |
| JP | 2009-019243 | 1/2009 |
| JP | 2009-87910 | 4/2009 |
| KR | 10-0257219 B1 | 2/2000 |
| KR | 10-2000-0019254 | 4/2000 |
| KR | 10-2000-0023929 | 5/2000 |
| KR | 10-2001-0059939 | 7/2001 |
| KR | 10-2002-0000201 | 1/2002 |
| KR | 10-2002-0050922 | 6/2002 |
| KR | 10-2002-0090934 | 12/2002 |
| KR | 10-0405080 B1 | 11/2003 |
| KR | 10-2003-0091947 | 12/2003 |
| KR | 10-2003-0093959 | 12/2003 |
| KR | 10-2004-0034537 | 4/2004 |
| KR | 10-2004-0050045 | 6/2004 |
| KR | 10-2004-0069281 | 8/2004 |
| KR | 10-2004-0084747 | 10/2004 |
| KR | 10-0463212 B1 | 12/2004 |
| KR | 10-0483487 B1 | 4/2005 |
| KR | 10-0520159 B1 | 10/2005 |
| KR | 10-2006-0008602 | 1/2006 |
| KR | 10-2006-0018745 | 3/2006 |
| KR | 10-2006-0060994 | 6/2006 |
| KR | 10-2006-0073367 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0104675 | 10/2006 |
| KR | 10-2006-0104677 | 10/2006 |
| KR | 10-2006-0109627 | 10/2006 |
| KR | 10-0635903 B1 | 10/2006 |
| KR | 10-0646160 B1 | 11/2006 |
| KR | 10-0687007 B1 | 2/2007 |
| KR | 10-0696547 B1 | 3/2007 |
| KR | 10-0697663 B1 | 3/2007 |
| KR | 10-0698033 B1 | 3/2007 |
| KR | 10-0700466 B1 | 3/2007 |
| KR | 10-2007-0035796 | 4/2007 |
| KR | 10-0711885 B1 | 4/2007 |
| KR | 10-0723627 B1 | 5/2007 |
| KR | 10-0726132 B1 | 6/2007 |
| KR | 10-2007-0078713 | 8/2007 |
| KR | 10-2007-0080635 | 8/2007 |

(56) References Cited

FOREIGN PATENT DOCUMENTS

| KR | 10-2007-0101842 | | 10/2007 |
|---|---|---|---|
| KR | 10-2007-0105595 | | 10/2007 |
| KR | 10-0770653 | B1 | 10/2007 |
| KR | 10-2008-0001184 | | 1/2008 |
| KR | 10-0797787 | B1 | 1/2008 |
| KR | 10-0800125 | | 1/2008 |
| KR | 10-0815265 | | 3/2008 |
| KR | 10-0823508 | B1 | 4/2008 |
| KR | 10-0827760 | B1 | 5/2008 |
| KR | 10-0839380 | B1 | 6/2008 |
| KR | 10-2008-0060400 | | 7/2008 |
| KR | 10-2008-0061132 | | 7/2008 |
| KR | 10-2008-0062212 | | 7/2008 |
| KR | 10-2009-0038733 | | 4/2009 |
| KR | 10-2009-0079765 | A | 7/2009 |
| KR | 10-2009-0097453 | | 9/2009 |
| KR | 10-2009-0098186 | | 9/2009 |
| KR | 10-2010-0002381 | | 1/2010 |

OTHER PUBLICATIONS

Japanese Office action dated Jan. 22, 2013, for corresponding Japanese Patent application 2010-116470 (3 pages).
Japanese Office action dated Jan. 8, 2013, for Japanese Patent application 2011-000180, (3 pages).
Patent Abstracts of Japan, and English machine translation of Japanese Publication 2004-349101 listed above (11 pages).
SIPO Certificate of Patent dated Jul. 31, 2013, corresponding to Chinese Patent application 201110029291.3, (31 pages).
U.S. Office action dated Aug. 8, 2013, for cross reference U.S. Appl. No. 13/093,707, (7 pages).
U.S. Office action dated Jul. 24, 2013, issued to U.S. Appl. No. 12/784,804, (52 pages).
U.S. Office action dated Nov. 25, 2013, issued to U.S. Appl. No. 13/176,701, (49 pages).
SIPO Office action dated Nov. 28, 2012, for Chinese Patent application 201110029291.3, (11 pages).
SIPO Office action dated May 29, 2013, for Chinese Patent application 201010189614.0, (12 pages).
U.S. Office action dated Jun. 11, 2013, for cross reference U.S. Appl. No. 12/979,656, (50 pages).
European Search Report dated Sep. 6, 2010, for European Patent application 10250962.7, (5 pages).
European Search Report dated May 31, 2011, for European Patent application 11250019.4, (6 pages).
European Search Report dated May 20, 2011, for European Patent application 10251404.9, (12 pages).
KIPO Office action dated Jul. 1, 2011, for Korean Patent application 10-2009-0072111, (4 pages).
KIPO Office action dated Jun. 1, 2011, for Korean Patent application 10-2009-0050528, (4 pages).
KIPO Registration Determination Certificate dated Oct. 27, 2011, for Korean Patent application 10-2010-0005381, (5 pages).
KIPO Registration Determination Certificate dated Sep. 23, 2011, for Korean Patent application 10-2009-0055473, (5 pages).
KIPO Registration Determination Certificate dated Sep. 28, 2011, for Korean Patent application 10-2009-0052359, (5 pages).
KIPO Registration Determination Certificate dated Sep. 28, 2011, for Korean Patent application 10-2009-0045200, (5 pages).
KIPO Registration Determination Certificate dated Sep. 28, 2011, for Korean Patent application 10-2009-0045201, (5 pages).
U.S. Office action dated Dec. 13, 2011, for cross reference U.S. Appl. No. 12/849,193, (30 pages).
U.S. Office action dated Mar. 23, 2012, for cross reference U.S. Appl. No. 12/849,193, (17 pages.
Patent Abstracts of Japan, and English machine translation of Japanese Publication 2001-052862, (20 pages).
Patent Abstracts of Japan, and English machine translation of Japanese Publication 2003-003250, (25 pages).
Korean Patent Abstracts, Publication No. 1020020086047, dated Nov. 18, 2002, for corresponding Korean Patent 10-0405080 listed above.
Korean Patent Abstracts, Publication No. 1020020088662, dated Nov. 29, 2002, for corresponding Korean Patent 10-0463212 listed above.
Korean Patent Abstracts, Publication No. 1020050045619, dated May 17, 2005, for corresponding Korean Patent 10-0520159 listed above.
Korean Patent Abstracts, Publication No. 1020040062203, dated Jul. 7, 2002, for corresponding Korean Patent 10-0646160 listed above.
Korean Patent Abstracts, Publication No. 1020060101987, dated Sep. 27, 2006, for corresponding Korean Patent 10-0687007 listed above.
Korean Patent Abstracts, Publication No. 1020020056238, dated Jul. 10, 2002, for corresponding Korean Patent 10-0698033 listed above.
Korean Patent Abstracts, Publication No. 1020050078637, dated Aug. 5, 2005, for corresponding Korean Patent 10-0700466 listed above.
Korean Patent Abstracts, Publication No. 1020070025164, dated Mar. 8, 2007, for corresponding Korean Patent 10-0711885 listed above.
Korean Patent Abstracts, Publication No. 1020020034272, dated May 9, 2002, for corresponding Korean Patent 10-0726132 listed above.
Korean Patent Abstracts, Publication No. 1020060126267, dated Dec. 6, 2006, for corresponding Korean Patent 10-0797787 listed above.
English Abstract, Publication No. 1020080002189, dated Jan. 4, 2008, for corresponding Korean Patent 10-0800125 listed above.
Korean Patent Abstracts, Publication No. 1020010062735, dated Jul. 7, 2001, for corresponding Korean Patent 10-0827760 listed above.
Korean Patent Abstracts, Publication No. 1020080038650, dated May 7, 2008, for corresponding Korean Patent 10-0839380 listed above.

* cited by examiner

ORGANIC LAYER DEPOSITION APPARATUS, METHOD OF MANUFACTURING ORGANIC LIGHT-EMITTING DISPLAY APPARATUS USING THE SAME, AND ORGANIC LIGHT-EMITTING DISPLAY APPARATUS MANUFACTURED USING THE METHOD

CROSS-REFERENCE TO RELATED PATENT APPLICATION

This application claims priority to and the benefit of Korean Patent Application No. 10-2012-0067303, filed on Jun. 22, 2012, in the Korean Intellectual Property Office, the disclosure of which is incorporated herein in its entirety by reference.

BACKGROUND

1. Field

Aspects of the present invention relate to an organic layer deposition apparatus, a method of manufacturing an organic light-emitting display device by using the same, and an organic light-emitting display device manufactured using the method.

2. Description of the Related Art

Organic light-emitting display devices have wider viewing angles, better contrast characteristics, and faster response speeds than other display devices, and thus have drawn attention as a next-generation display device.

An organic light-emitting display device includes intermediate layers (including an emission layer) disposed between a first electrode and a second electrode. The electrodes and the intermediate layers may be formed using various methods, one of which is an independent deposition method. When an organic light-emitting display device is manufactured by using the deposition method, a fine metal mask (FMM) having the same pattern as that of an organic layer to be formed is disposed to closely contact a substrate on which the organic layer and the like are formed, and an organic layer material is deposited on the FMM to form the organic layer having the desired pattern.

However, the deposition method using such an FMM presents difficulties in manufacturing larger organic light-emitting display devices using a large mother glass. For example, when such a large mask is used, the mask may bend due to self-gravity, thereby distorting a pattern. Such disadvantages are not conducive to the recent trend towards high-definition patterns.

Moreover, processes of aligning a substrate and an FMM to closely contact each other, performing deposition thereon, and separating the FMM from the substrate are time-consuming, resulting in a long manufacturing time and low production efficiency.

Information disclosed in this Background section was already known to the inventors of the present invention before achieving the present invention or is technical information acquired in the process of achieving the present invention. Therefore, it may contain information that does not form the prior art that is already known in this country to a person of ordinary skill in the art.

SUMMARY

In order to address the drawback of the deposition method using a fine metal mask (FMM) and/or other issues, aspects of the present invention are directed toward organic layer deposition apparatuses that are suitable for use in the mass production of a large substrate and enable high-definition patterning, methods of manufacturing organic light-emitting display devices by using the same, and organic light-emitting display devices manufactured using the methods.

According to an embodiment of the present invention, there is provided an organic layer deposition apparatus including: a conveyer unit including a transfer unit that fixes a substrate and is formed to move along with the substrate, a first conveyer unit that moves in a first direction the transfer unit on which the substrate is fixed, and a second conveyer unit that moves in a direction opposite to the first direction the transfer unit from which the substrate is separated after deposition has been completed; a loading unit fixing the substrate on the transfer unit; a deposition unit including a chamber maintained in a vacuum state and at least one organic layer deposition assembly depositing an organic layer on the substrate fixed on the transfer unit transferred from the loading unit; and an unloading unit separating, from the transfer unit, the substrate on which the deposition has been completed while passing through the deposition unit, wherein the transfer unit is formed to cyclically move between the first conveyer unit and the second conveyer unit, and wherein the substrate fixed on the transfer unit is formed spaced apart from the at least one organic layer deposition assembly by a set distance while being transferred by the first conveyer unit.

When the first conveyer unit and the second conveyer unit pass through the deposition unit, the first conveyer unit and the second conveyer unit may be respectively arranged above and below in parallel to each other.

A plurality of the deposition units may be arranged in parallel to each other, one patterning slit sheet replacement unit may be disposed between two adjacent deposition units of the plurality of deposition units, and a patterning slit sheet of the two adjacent deposition units may enter into and may be drawn out of the one patterning slit sheet replacement unit.

The first conveyer unit may sequentially convey the transfer unit into the loading unit, the deposition unit, and the unloading unit.

The second conveyer unit may sequentially convey the transfer unit into the unloading unit, the deposition unit, and the loading unit.

The at least one organic layer deposition assembly may include: a deposition source discharging a deposition material; a deposition source nozzle unit that is disposed at a side of the deposition source and includes a plurality of deposition source nozzles; and a patterning slit sheet facing the deposition source nozzle unit and including a plurality of patterning slits arranged along a direction, and the deposition material discharged from the deposition source may pass through the patterning slit sheet to be deposited on the substrate in a certain pattern.

The patterning slit sheet of the at least one organic layer deposition assembly may be formed smaller than the substrate in at least any one of the first direction and a second direction perpendicular to the first direction.

The organic layer deposition apparatus may include a plurality of the organic layer deposition assemblies, and respective deposition sources of the plurality of organic layer deposition assemblies may include different deposition materials.

While the substrate is being moved relative to the organic layer deposition apparatus, respective deposition materials of the at least one organic layer deposition assembly may be sequentially deposited on the substrate.

The organic layer deposition apparatus and the substrate may be moved relative to each other along a surface parallel to a surface of the substrate on which the deposition material is deposited.

The transfer unit may include a carrier moved by the first conveyer unit and the second conveyer unit and an electrostatic chuck that is fixedly combined to the carrier to fix the substrate.

A magnetic rail may be formed on a surface of the carrier, each of the first conveyer unit and the second conveyer unit may include a plurality of coils, wherein the magnetic rail and the plurality of coils are combined together to constitute an operation unit generating a driving force to move the transfer unit.

The first conveyer unit may include guide members each including an accommodation groove, wherein the respective accommodation grooves accommodate both sides of the transfer unit, to guide the transfer unit to move in the first direction; and a magnetically suspended bearing suspending the transfer unit from the accommodation grooves so as to move the transfer unit in non-contact with the accommodation grooves.

The magnetically suspended bearing may include side magnetically suspended bearings arranged on both side surfaces of the carrier and upper magnetically suspended bearings arranged above the carrier.

The first conveyer unit may further include a gap sensor that measures a distance between the guide member and the carrier.

The plurality of coils may be formed in an atmosphere (ATM) box.

The ATM box may be connected to the chamber by bellows.

At least one cam follower may be disposed on both side surfaces of the carrier, the second conveyer unit may include a roller guide to support the at least one cam follower, wherein the at least one cap follower of the carrier is moved along the roller guide.

A contactless power supply (CPS) module is disposed in the carrier and a charging track is formed in a portion of the second conveyer unit which corresponds to the CPS module, wherein when the carrier is transferred in the second conveyer unit, a magnetic field is formed between the charging track and the CPS module so as to supply power to the CPS module in a non-contact manner.

The chamber may further include an upper housing accommodating the first conveyer unit and the at least one organic layer deposition assembly and a lower housing accommodating the second conveyer unit.

The deposition source and a deposition source nozzle may be formed in the upper housing, wherein a first stage transferring the patterning slit sheet in the first direction and a second direction perpendicular to the first direction, a second stage transferring the patterning slit sheet in a third direction perpendicular to each of the first and second directions, and the patterning slit sheet are sequentially stacked on the deposition source and the deposition source nozzle.

The patterning slit sheet and the substrate may be aligned with each other by the movement of the first stage and the second stage.

The organic layer deposition apparatus may further include a shielding member disposed between the deposition source and the patterning slit sheet, wherein the shielding member moves along with the substrate so as to screen at least a portion of the substrate.

The shielding member may be formed to screen a non-film-forming region of the substrate.

The patterning slit sheet may include a first alignment mark, the substrate may include a second alignment mark, and the deposition unit may further include a camera that photographs the first alignment mark and the second alignment mark to detect a relative position of the substrate to the patterning slit sheet.

The deposition unit may further include a sensor for measuring a distance between the substrate and the patterning slit sheet, and the sensor may be disposed on the substrate and sense a surface of the substrate and a surface of the patterning slit sheet so as to measure a distance between the substrate and the patterning slit sheet.

The sensor may be a confocal sensor.

According to another embodiment of the present invention, there is provided a method of manufacturing an organic light-emitting display device by using an organic layer deposition apparatus for forming an organic layer on a substrate, the method including: fixing the substrate on a transfer unit in a loading unit; conveying into a chamber the transfer unit on which the substrate is fixed, by using a first conveyer unit installed to pass through the chamber; forming an organic layer by depositing a deposition material discharged from an organic layer deposition assembly on the substrate while the substrate is moved relative to the organic layer deposition assembly with the organic layer deposition assembly in the chamber being spaced apart from the substrate by a predetermined distance; separating the substrate on which the depositing has been completed from the transfer unit in an unloading unit; and conveying the transfer unit from which the substrate is separated to the loading unit by using a second conveyer unit installed to pass through the chamber.

The chamber may include a plurality of the organic layer deposition assemblies, and deposition may be sequentially performed on the substrate by using each of the plurality of organic layer deposition assemblies.

The transfer unit may be cyclically moved between the first conveyer unit and the second conveyer unit.

The first conveyer unit and the second conveyer unit may be respectively arranged above and below in parallel to each other.

The transfer unit may be transferred in the chamber in non-contact with the first conveyer unit.

The organic layer deposition apparatus may include a plurality of the organic layer deposition assemblies that discharge different deposition materials.

The forming may include concurrently depositing on the substrate respective deposition materials discharged from a plurality of the organic layer deposition assemblies.

The organic layer deposition assembly may include: a deposition source discharging a deposition material; a deposition source nozzle unit that is disposed at a side of the deposition source and includes a plurality of deposition source nozzles; and a patterning slit sheet facing the deposition source nozzle unit and including a plurality of patterning slits arranged along a second direction perpendicular to a first direction, and the deposition material discharged from the deposition source may pass through the patterning slit sheet to be deposited on the substrate in a certain pattern.

The patterning slit sheet of the organic layer deposition assembly may be formed smaller than the substrate in at least any one of the first direction and the second direction perpendicular to the first direction.

According to another embodiment of the present invention, there is provided an organic light-emitting display device including: a substrate; at least one thin film transistor that is disposed on the substrate and includes a semiconductor active layer, a gate electrode insulated from the semiconductor active layer, and source and drain electrodes each contacting the semiconductor active layer; a plurality of pixel electrodes disposed on the at least one thin film transistor; a plurality of organic layers disposed on the plurality of the pixel electrodes; and a counter electrode disposed on the plurality of organic layers, wherein a length of a hypotenuse of at least one of the plurality of organic layers formed on the substrate farther from a center of a deposition region is larger than lengths of hypotenuses of the other organic layers formed close to the center of the deposition region, and wherein the at least one of the plurality of organic layers formed on the substrate is a linearly-patterned organic layer formed using the organic layer deposition apparatus described above.

The substrate may have a size of 40 inches or more.

The plurality of organic layers may include at least an emission layer.

The plurality of organic layers may have a non-uniform thickness.

In each of the organic layers formed farther from the center of the deposition region, a hypotenuse farther from the center of the deposition region may be larger than the other hypotenuse.

In one embodiment, the further one of the plurality of organic layers formed in the deposition region is from the center of the deposition region, the narrower an overlapped region of two sides of the one of the plurality of organic layers is formed.

Hypotenuses of the organic layer disposed at the center of the deposition region may have substantially the same length.

The plurality of organic layers disposed in the deposition region may be symmetrically arranged about the center of the deposition region.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
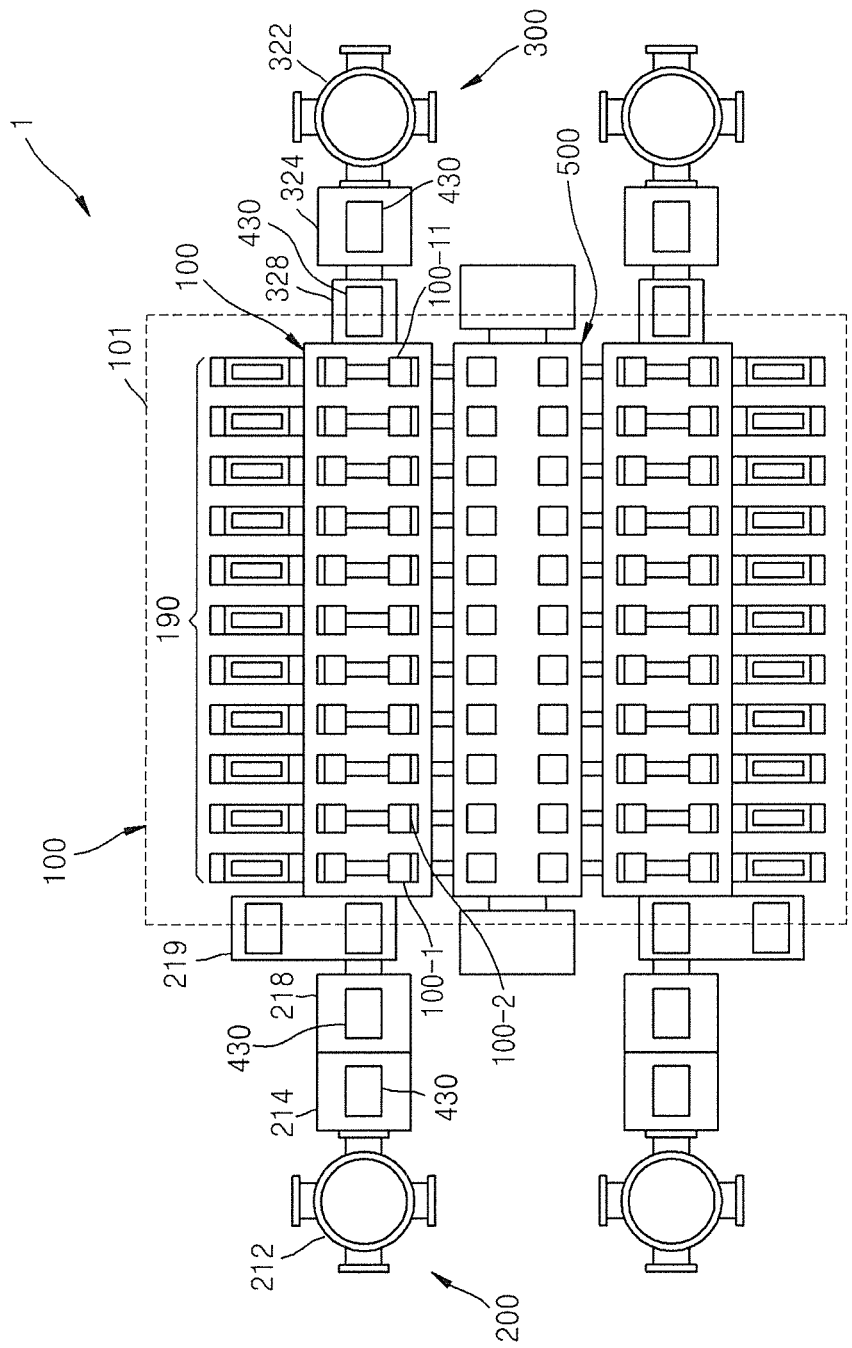
FIG. 1 is a schematic plan view illustrating a structure of an organic layer deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain aspects of the present invention by referring to the figures. Expressions such as "at least one of," when preceding a list of elements, modify the entire list of elements and do not modify the individual elements of the list.

Figure 2:
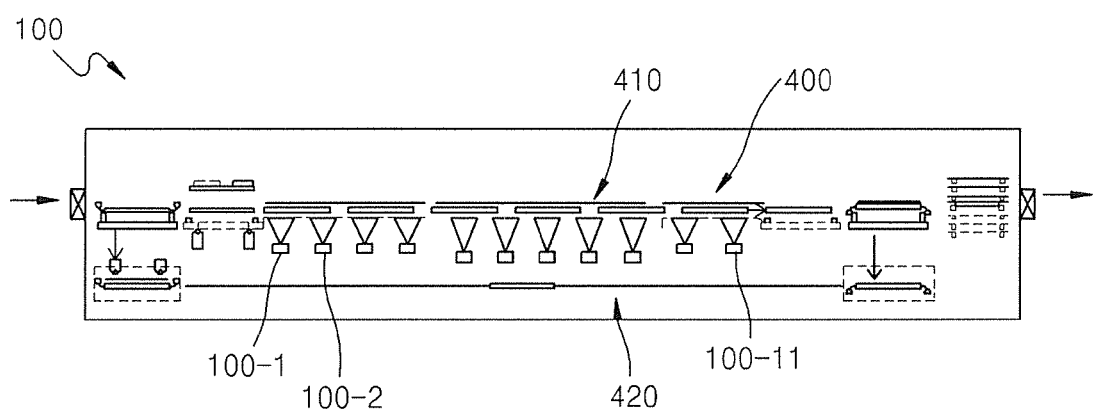
FIG. 2 is a schematic side view of a deposition unit of the organic layer deposition apparatus of FIG. 1, according to an embodiment of the present invention.

FIG. 1 is a schematic plan view illustrating a structure of an organic layer deposition apparatus 1 according to an embodiment of the present invention. FIG. 2 is a schematic side view of a deposition unit 100 of the organic layer deposition apparatus 1 of FIG. 1, according to an embodiment of the present invention.

Referring to FIGS. 1 and 2, the organic layer deposition apparatus 1 includes the deposition unit 100, a loading unit 200, an unloading unit 300, and a conveyer unit 400.

The loading unit 200 may include a first rack 212, a transport chamber 214, a first inversion chamber 218, and a buffer chamber 219.

A plurality of substrates 2 onto which a deposition material has not yet been applied are stacked up on the first rack 212. A transport robot included in the transport chamber 214 picks up one of the substrates 2 from the first rack 212, disposes it on a transfer unit 430 transferred by a second conveyer unit 420, and moves the transfer unit 430 on which the substrate 2 is disposed into the first inversion chamber 218.

The first inversion chamber 218 is disposed adjacent to the transport chamber 214. The first inversion chamber 218 includes a first inversion robot that inverts the transfer unit 430 and then loads it on a first conveyer unit 410 of the deposition unit 100.

Referring to FIG. 1, the transport robot of the transport chamber 214 places one of the substrates 2 on a top surface of the transfer unit 430, and the transfer unit 430 on which the substrate 2 is disposed is then transferred into the first inversion chamber 218. The first inversion robot of the first inversion chamber 218 inverts the first inversion chamber 218 so that the substrate 2 is turned upside down in the deposition unit 100.

The unloading unit 300 is configured to operate in an opposite manner to the loading unit 200 described above. Specifically, a second inversion robot in a second inversion chamber 328 inverts the transfer unit 430, which has passed through the deposition unit 100 while the substrate 2 is disposed on the transfer unit 430, and then moves the transfer unit 430 on which the substrate 2 is disposed into an ejection chamber 324. Then, an ejection robot takes the transfer unit 430 on which the substrate 2 is disposed out of the ejection chamber 324, separates the substrate 2 from the transfer unit 430, and then loads the substrate 2 on a second rack 322. The transfer unit 430, separated from the substrate 2, is returned to the loading unit 200 via the second conveyer unit 420.

However, the present invention is not limited to the above example. For example, when disposing the substrate 2 on the transfer unit 430, the substrate 2 may be fixed onto a bottom surface of the transfer unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. In one embodiment, as illustrated in FIGS. 1 and 2, the deposition unit 100 includes a chamber 101 in which a plurality of organic layer deposition assemblies (100-1)(100-2) ... (100-n) may be disposed. Referring to FIG. 1, 11 organic layer deposition assemblies, i.e., a first organic layer deposition assembly (100-1), a second organic layer deposition assembly (100-2), and an eleventh organic layer deposition assembly (100-11), are disposed in the chamber 101, but the number of organic layer deposition assemblies may vary with a desired deposition material and deposition conditions. The chamber 101 is maintained in vacuum during the deposition process.

In this regard, some of the 11 organic layer deposition assemblies may be used for deposition to form a common layer, and the rest of the 11 organic layer deposition assemblies may be used for deposition to form a pattern layer. In this embodiment, the organic layer deposition assemblies used for deposition to form a common layer may not include a patterning slit sheet 130 (refer to FIG. 3). According to one embodiment, the 11 organic layer deposition assemblies may be configured such that the first organic layer deposition assembly 100-1 performs deposition for forming a hole injection layer (HIL) as a common layer, the second organic layer deposition assembly 100-2 performs deposition for forming an injection layer (IL) as a common layer, the third organic layer deposition assembly 100-3 and the fourth organic layer deposition assembly 100-4 perform deposition for forming a hole transport layer (HTL) as a common layer, the fifth organic layer deposition assembly 100-5 performs deposition for forming, e.g., an R' material and/or a G' material in the HTL as a common layer, the sixth organic layer deposition assembly 100-6 performs deposition for forming an R" material in the HTL as a common layer, the seventh organic layer deposition assembly 100-7 performs deposition for forming a red emission layer (R EML) as a pattern layer, the eighth organic layer deposition assembly 100-8 performs deposition for forming a green emission layer (G EML) as a pattern layer, the ninth organic layer deposition assembly 100-9 performs deposition for forming a blue emission layer (B EML) as a pattern layer, the tenth organic layer deposition assembly 100-10 performs deposition for forming an electron transport layer (ETL) as a common layer, and the eleventh organic layer deposition assembly 100-11 performs deposition for forming an electron injection layer (EIL) as a common layer. The organic layer deposition assemblies described above may also be arranged in various forms.

In the embodiment illustrated in FIG. 1, the transfer unit 430 with the substrate 2 fixed thereon may be moved at least to the deposition unit 100 or may be moved sequentially to the loading unit 200, the deposition unit 100, and the unloading unit 300, by the first conveyer unit 410, and the transfer unit 430 that is separated from the substrate 2 in the unloading unit 300 may be moved back to the loading unit 200 by the second conveyer unit 420.

The first conveyer unit 410 passes through the chamber 101 when passing through the deposition unit 100, and the second conveyer unit 420 conveys the transfer unit 430 from which the substrate 2 is separated.

In the present embodiment, the organic layer deposition apparatus 1 is configured such that the first conveyer unit 410 and the second conveyer unit 420 are respectively disposed above and below so that after the transfer unit 430, on which deposition has been completed while passing through the first conveyer unit 410, is separated from the substrate 2 in the unloading unit 300, the transfer unit 430 is returned to the loading unit 200 via the second conveyer unit 420 formed below the first conveyer unit 410, whereby the organic layer deposition apparatus 1 may have an improved space utilization efficiency.

In an embodiment, the deposition unit 100 of FIG. 1 may further include a deposition source replacement unit 190 disposed at a side of each organic layer deposition assembly. Although not particularly illustrated in the drawings, the deposition source replacement unit 190 may be formed as a cassette-type that may be drawn to the outside from each organic layer deposition assembly. Thus, a deposition source 110 (refer to FIG. 3) of the organic layer deposition assembly 100-1 may be easily replaced.

FIG. 1 illustrates the organic layer deposition apparatus 1 in which two sets of structures each including the loading unit 200, the deposition unit 100, the unloading unit 300, and the conveyer unit 400 are arranged in parallel. That is, it can be seen that two organic layer deposition apparatuses 1 are respectively arranged at one side and another side of the organic deposition apparatus 1 (above and below in FIG. 1). In such an embodiment, a patterning slit sheet replacement unit 500 may be disposed between the two organic layer deposition apparatuses 1. That is, due to this configuration of structures, the two organic layer deposition apparatuses 1 share the patterning slit sheet replacement unit 500, resulting in improved space utilization efficiency, as compared to a case where each organic layer deposition apparatus 1 includes the patterning slit sheet replacement unit 500.

Figure 3:
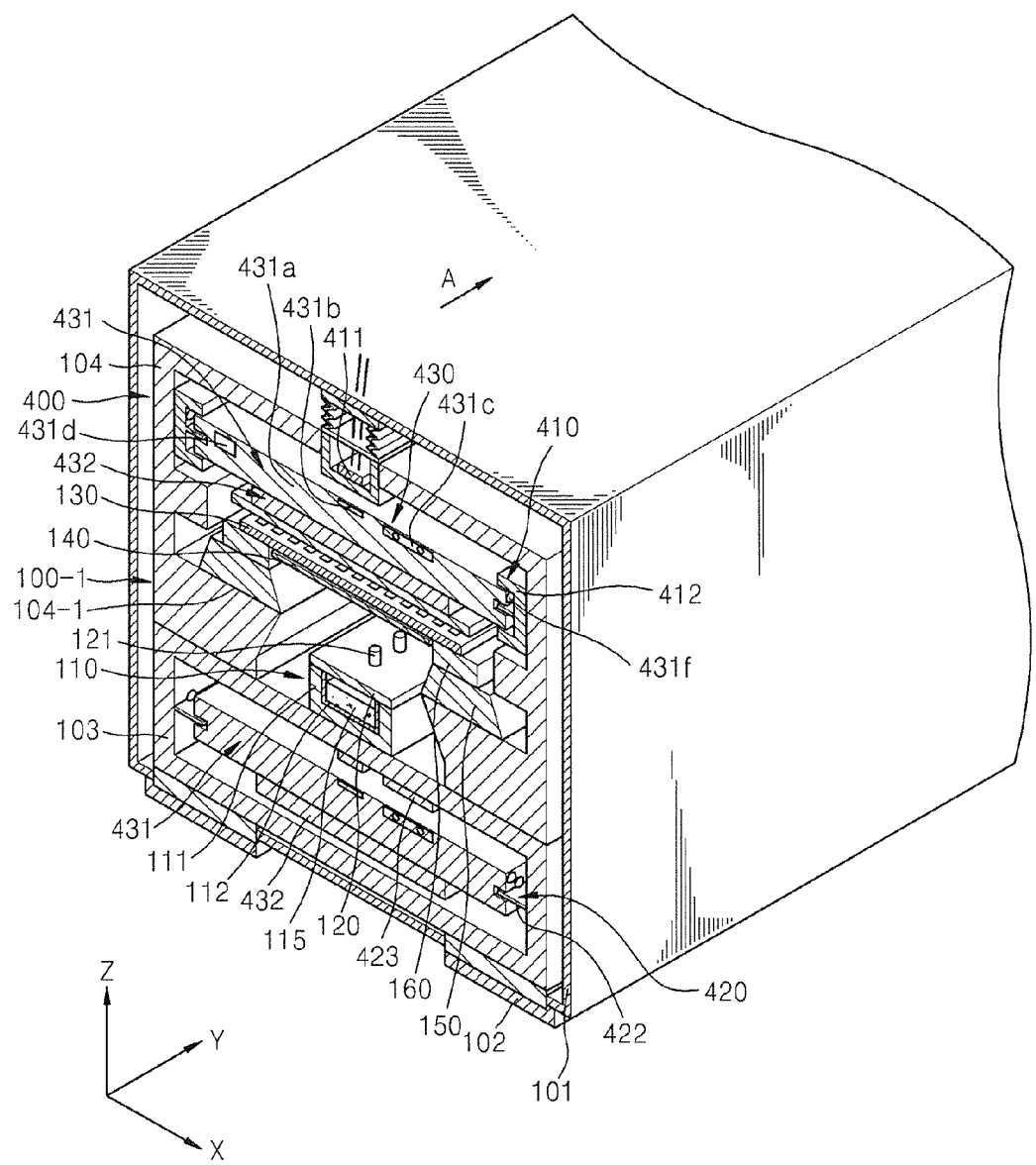
FIG. 3 is a schematic perspective view of the deposition unit of the organic layer deposition apparatus of FIG. 1, according to an embodiment of the present invention.
Figure 4:
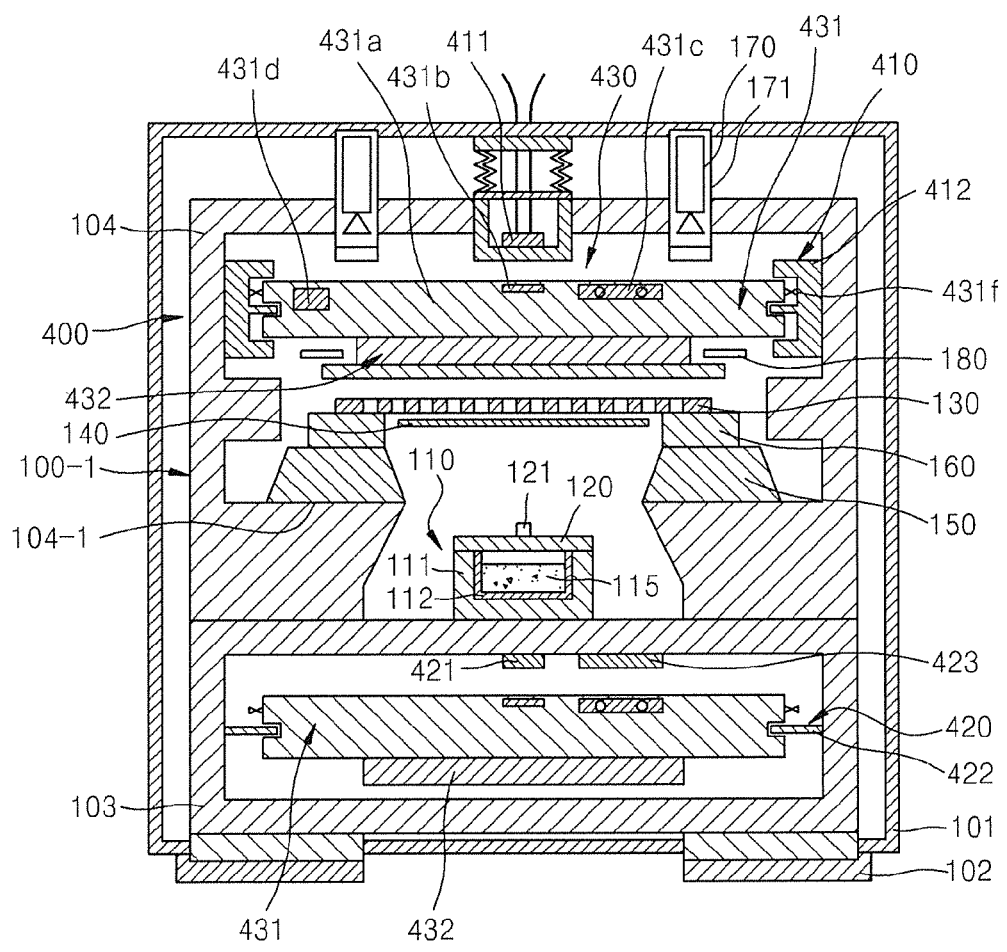
FIG. 4 is a schematic cross-sectional view of the deposition unit of FIG. 3, according to an embodiment of the present invention.
Figure 5:
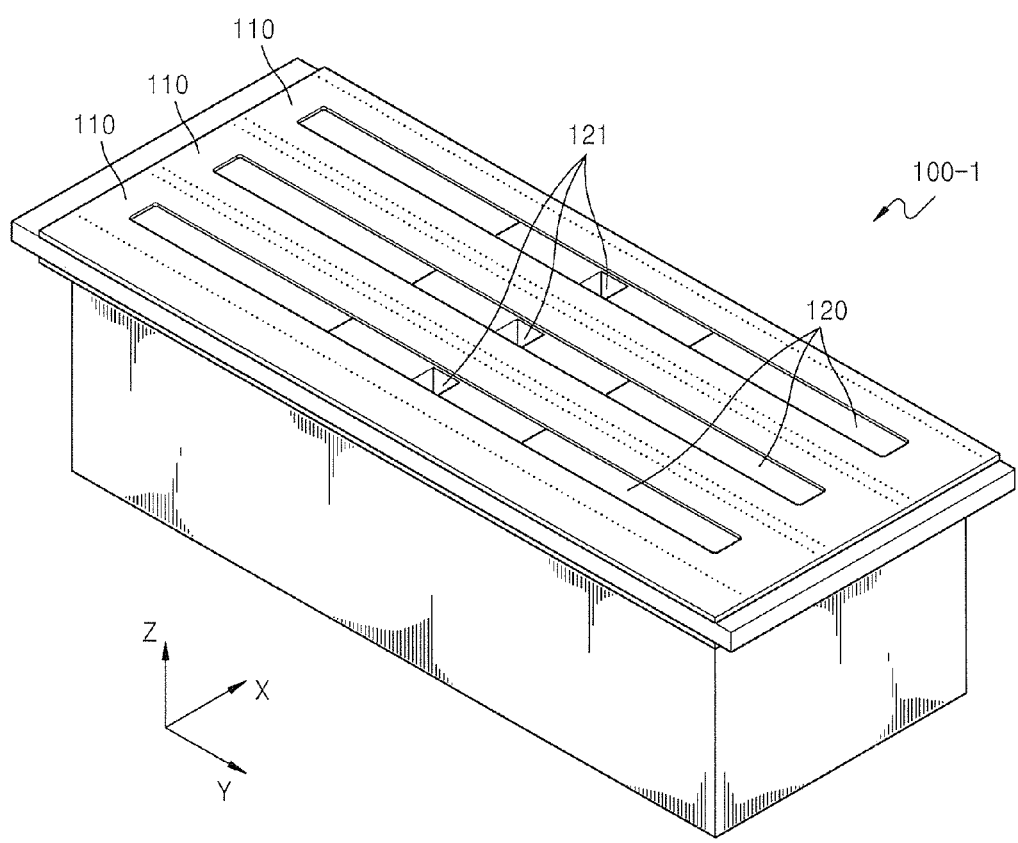
FIG. 5 is a perspective view of a deposition source of the deposition unit of FIG. 3, according to an embodiment of the present invention.
Figure 6:
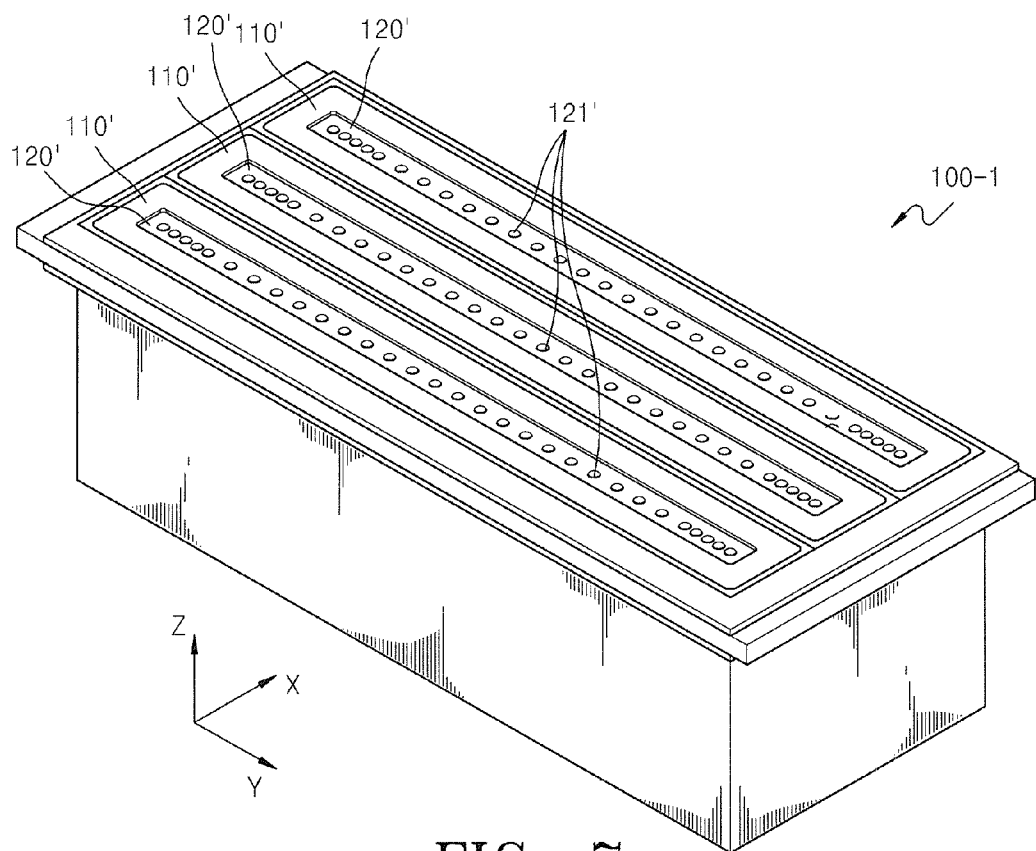
FIG. 6 is a perspective view of a deposition source of the deposition unit of FIG. 3, according to another embodiment of the present invention.
Figure 7:
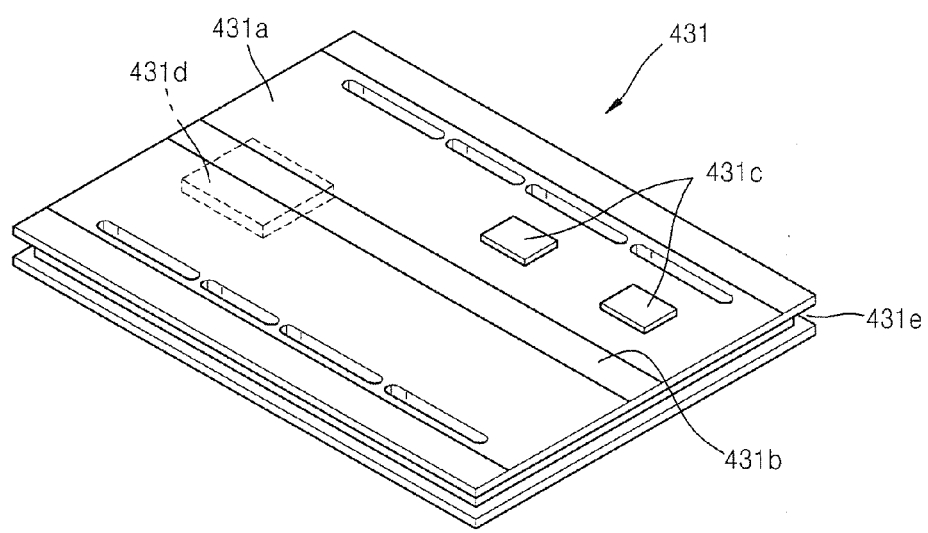
FIG. 7 is a perspective view particularly illustrating a carrier of a transfer unit of the deposition unit of FIG. 3, according to an embodiment of the present invention.
Figure 8:
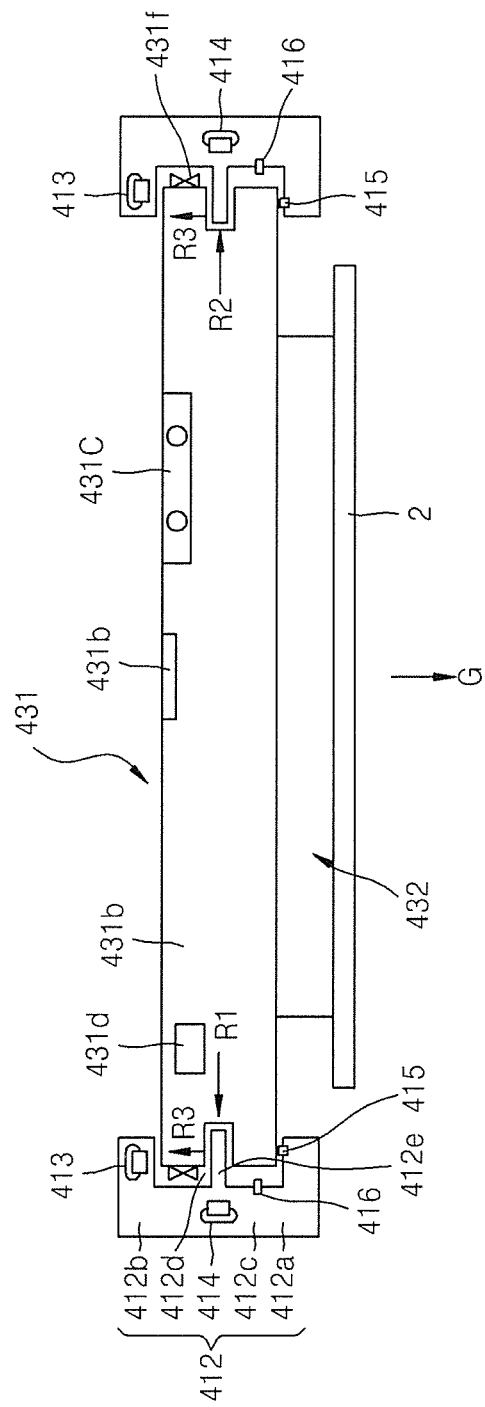
FIG. 8 is a cross-sectional view particularly illustrating a first conveyer unit and the transfer unit of the deposition unit of FIG. 3, according to an embodiment of the present invention.

FIG. 3 is a schematic perspective view of the deposition unit 100 of the organic layer deposition apparatus 1 of FIG. 1, according to an embodiment of the present invention. FIG. 4 is a schematic cross-sectional view of the deposition unit 100 of FIG. 3, according to an embodiment of the present invention. FIG. 5 is a perspective view of three deposition sources 110 of the deposition unit 100 of FIG. 3, according to an embodiment of the present invention. FIG. 6 is a perspective view of three deposition sources 110' of the deposition unit 100 of FIG. 3, according to another embodiment of the present invention. FIG. 7 is a perspective view particularly illustrating a carrier 431 of a transfer unit 430 of the deposition unit 100 of FIG. 3, according to an embodiment of the present invention. FIG. 8 is a cross-sectional view particularly illustrating a first conveyer unit 410 and a transfer unit 430 of the deposition unit 100 of FIG. 3, according to an embodiment of the present invention.

Referring to FIGS. 3 and 4, the deposition unit 100 of the organic layer deposition apparatus 1 includes at least one organic layer deposition assembly 100-1 and a conveyer unit 400.

Hereinafter, an overall structure of the deposition unit 100 will be described.

The chamber 101 may be formed as a hollow box type and accommodate the at least one organic layer deposition assembly 100-1 and the transfer unit 430. In another descriptive manner, a foot 102 is formed so as to fix the deposition unit 100 on the ground, a lower housing 103 is disposed on the foot 102, and an upper housing 104 is disposed on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are disposed on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes the organic layer deposition assembly 100-1 and the first conveyer unit 410 of the conveyer unit 400, and the lower housing 103 includes the second conveyer unit 420 of the conveyer unit 400. While the transfer unit 430 is cyclically moving between the first conveyer unit 410 and the second conveyer unit 420, a deposition process is continuously performed.

Hereinafter, constituents of the organic layer deposition assembly 100-1 are described in detail.

The first organic layer deposition assembly 100-1 includes the deposition source 110, a deposition source nozzle unit 120, the patterning slit sheet 130, a shielding member 140, a first stage 150, a second stage 160, a camera 170, and a sensor 180. In this regard, all the elements illustrated in FIGS. 3 and 4 may be arranged in the chamber 101 maintained in an appropriate vacuum state. This structure is needed to achieve the linearity of a deposition material.

In particular, in order to deposit a deposition material 115 that has been discharged from the deposition source 110 and passed through the deposition source nozzle unit 120 and the patterning slit sheet 130, onto the substrate 2 in a desired pattern, it is desirable to maintain the chamber (not shown) in the same vacuum state as that used in a deposition method of an FMM. In addition, the temperature of the patterning slit sheet 130 should be sufficiently lower than that of the deposition source 110 (about 100° C. or less) because thermal expansion of the patterning slit sheet 130 is minimized when the temperature of the patterning slit sheet 130 is sufficiently low.

The substrate 2 on which the deposition material 115 is to be deposited is arranged in the chamber 101. The substrate 2 may be a substrate for a flat panel display device. For example, a large substrate, such as a mother glass, for manufacturing a plurality of flat panel displays, may be used as the substrate 2.

According to an embodiment, the deposition process may be performed with the substrate 2 being moved relative to the organic layer deposition assembly 100-1.

In a conventional deposition method using an FMM, the size of the FMM needs to be the same as that of a substrate. Thus, as the size of the substrate increases, the FMM also needs to be large in size. Due to these problems, it is difficult to fabricate the FMM and to align the FMM in a precise pattern by elongation of the FMM.

To address these problems, in the organic layer deposition assembly 100-1 according to the present embodiment, deposition may be performed while the organic layer deposition assembly 100-1 and the substrate 2 are moved relative to each other. In other words, deposition may be continuously performed while the substrate 2, which faces the organic layer deposition assembly 100-1, is moved in a Y-axis direction.

That is, deposition is performed in a scanning manner while the substrate 2 is moved in a direction of arrow A illustrated in FIG. 3. Although the substrate 2 is illustrated as being moved in the Y-axis direction in the chamber 101 in FIG. 3 when deposition is performed, the present invention is not limited thereto. For example, deposition may be performed while the organic layer deposition assembly 100-1 is moved in the Y-axis direction and the substrate 2 is held in a fixed position.

Thus, in the organic layer deposition assembly 100-1, the patterning slit sheet 130 may be much smaller than an FMM used in a conventional deposition method. In other words, in the organic layer deposition assembly 100-1, deposition is continuously performed, i.e., in a scanning manner while the substrate 2 is moved in the Y-axis direction. Thus, at least one of the lengths of the patterning slit sheet 130 in X-axis and Y-axis directions may be much less than a length of the substrate 2. Since the patterning slit sheet 130 may be formed much smaller than the FMM used in a conventional deposition method, it is easy to manufacture the patterning slit sheet 130. That is, the small patterning slit sheet 130 is more advantageous in the manufacturing processes, including etching followed by precise elongation, welding, transferring, and washing processes, than the FMM used in a conventional deposition method. In addition, this is more advantageous for manufacturing a relatively large display device.

In order to perform deposition while the organic layer deposition assembly 100-1 and the substrate 2 are moved relative to each other as described above, the organic layer deposition assembly 100-1 and the substrate 2 may be spaced apart from each other by a certain distance. This is described below in more detail.

The deposition source 110 that contains and heats the deposition material 115 is disposed at a side opposite to (facing) a side in which the substrate 2 is disposed in the chamber. As the deposition material 115 contained in the deposition source 110 is vaporized, deposition is performed on the substrate 2.

The deposition source 110 includes a crucible 111 that is filled with the deposition material 115 and a heater 112 that heats the crucible 111 so as to vaporize the deposition material 115 toward a side of the crucible 111 filled with the deposition material 115, in particular, toward the deposition source nozzle unit 120.

The deposition source 110, in one embodiment, is disposed at a side of the deposition source 110 facing the substrate 2. In this regard, the organic layer deposition assemblies according to the present embodiment each may include different deposition nozzles in performing deposition for forming common layers and pattern layers. This structure will be described below in more detail.

FIG. 5 is a perspective view of deposition source nozzles for forming a pattern layer. FIG. 6 is a perspective view of deposition source nozzles for forming a common layer.

Referring to FIG. 5, the organic layer deposition assembly 100-1 includes the three deposition sources 110 and three deposition source nozzle units 120. Each deposition source nozzle unit 120 includes a deposition source nozzle 121 at a central portion thereof. The deposition material 115 that has been vaporized in the deposition source 110 passes through the deposition source nozzle unit 120 and is deposited onto the substrate 2 on which the deposition material 115 is to be deposited. The deposition source nozzle 121 is formed in the deposition source nozzle unit 120 and the three deposition sources 110 are arranged in the organic layer deposition assembly 100-1 along a scanning direction of the substrate 2. That is, a plurality of deposition source nozzles 121 may be formed in the organic layer deposition assembly 100-1 along the scanning direction of the substrate 2. If the plurality of deposition source nozzles 121 are arranged in an X-axis direction, distances between the respective deposition source nozzles 121 and a patterning slit 131 (see FIG. 10) are different from each other, and thus, a shadow occurs on the substrate 2 by the deposition material 115 discharged from the deposition source nozzles 121 that are disposed far from the patterning slit 131. Thus, in the present embodiment, the deposition source nozzles 121 are formed such that only one line of the deposition source nozzles 121 is formed in the X-axis direction, to significantly reduce the occurrence of shadows. In addition, the deposition source nozzles 121 are arranged in the scanning direction of the substrate 2, and thus, a difference in flux occurring between the deposition source nozzles 121 may be compensated for and deposition uniformity may be maintained constant.

Although not illustrated in FIGS. 5 and 6, two of the three deposition sources 110, which are disposed at both sides of the other one in the middle, may be used to deposit a host material, and the other deposition source 110 disposed in the middle thereof may be used to deposit a dopant material. As described above, the organic layer deposition apparatus according to the present embodiment includes both a deposition source for depositing a host material and a deposition source for depositing a dopant material, and thus, the host material and the dopant material may be co-deposited on the substrate 2, and thus, the manufacturing processes may be simplified and performed fast, and an organic light-emitting display device, including the organic layer deposition apparatus, may have an improved efficiency.

Referring to FIG. 6, a deposition source nozzle unit 120' is disposed at a side of the deposition source 110', and in particular, at the side of the deposition source 110' facing the substrate 2. The deposition source nozzle unit 120' includes a plurality of deposition source nozzles 121' arranged along an X-axis direction (i.e., a direction perpendicular to the scanning direction of the substrate 2). In this regard, the plurality of deposition source nozzles 121' may be arranged at equal intervals or at smaller intervals towards both ends thereof. A deposition material that has been vaporized in the deposition source 110' passes through the deposition source nozzles 121' of the deposition source nozzle unit 120' and is then deposited onto the substrate 2. By arranging the plurality of deposition source nozzles 121' along the X-axis direction (i.e., a direction perpendicular to the scanning direction of the substrate 2) so as to form a common layer, a thickness uniformity of the common layer may be improved.

In one embodiment, the patterning slit sheet 130 may be disposed between the deposition source 110 and the substrate 2. The patterning slit sheet 130 may further include a frame 135 having a shape similar to a window frame. The patterning slit sheet 130 includes a plurality of patterning slits 131 arranged in the X-axis direction. The deposition material 115 that has been vaporized in the deposition source 110 passes through the deposition source nozzle unit 120 and the patterning slit sheet 130 and is then deposited onto the substrate 2. In this regard, the patterning slit sheet 130 may be formed using the same method as that used to form an FMM, in particular, a stripe-type mask, e.g., etching. In this regard, a total number of patterning slits 131 may be more than a total number of deposition source nozzles 121.

In one embodiment, the deposition source 110 (and the deposition source nozzle unit 120 combined thereto) and the patterning slit sheet 130 may be spaced apart from each other by a certain distance.

As described above, deposition is performed while the organic layer deposition assembly 100-1 is moved relative to the substrate 2. In order for the organic layer deposition assembly 100-1 to be moved relative to the substrate 2, the patterning slit sheet 130 is disposed spaced apart from the substrate 2 by a certain distance.

In a conventional deposition method using an FMM, deposition is performed with the FMM in close contact with a substrate in order to prevent formation of shadows on the substrate. However, when the FMM is formed in close contact with the substrate, defects due to the contact between the substrate and the FMM may occur. In addition, since it is difficult to move the mask with respect to the substrate, the mask and the substrate need to be formed in the same size. Accordingly, the mask needs to be large as the size of a display device increases. However, it is difficult to form a large mask.

To address these problems, in the organic layer deposition assembly 100-1 according to the present embodiment, the patterning slit sheet 130 is formed spaced apart by a certain distance from the substrate 2 on which a deposition material is to be deposited.

According to the present embodiment, deposition may be performed while a mask formed smaller than a substrate is moved with respect to the substrate, and thus, it is easy to manufacture the mask. In addition, defects due to contact between the substrate and the mask may be prevented. In addition, since it is unnecessary to closely contact the substrate with the mask during a deposition process, a manufacturing speed may be improved.

Hereinafter, particular disposition of each element of the upper housing 104 will be described.

The deposition source 110 and the deposition source nozzle unit 120 are disposed on a bottom portion of the upper housing 104. Accommodation portions 104-1 are respectively formed on both sides of the deposition source 100 and the deposition source nozzle unit 120 to have a protruding shape. The first stage 150, the second stage 160, and the patterning slit sheet 130 are sequentially formed on the accommodation portions 104-1 in this order.

In this regard, the first stage 150 is formed to move in X-axis and Y-axis directions so that the first stage 150 aligns the patterning slit sheet 130 in the X-axis and Y-axis directions. That is, the first stage 150 includes a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is disposed on the second stage 160. The patterning slit sheet 130 is disposed on the first stage 150 and the second stage 160 so as to move in the X-axis, Y-axis, and Z-axis directions, and thus, an alignment, in particular, a real-time alignment, between the substrate 2 and the patterning slit sheet 130 may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may be thereby concurrently or simultaneously guided.

The shielding member 140 may be disposed between the patterning slit sheet 130 and the deposition source 110. In particular, an anode or cathode pattern is formed on an edge portion of the substrate 2 and is used as a terminal for inspecting a product or in manufacturing a product. If an organic material is applied on a region of the substrate 2, the anode or the cathode can not sufficiently perform its function. Thus, the edge portion of the substrate 2 is formed to be a non-film-forming region on which an organic material or the like is not applied. As described above, however, in the organic layer deposition apparatus, deposition is performed in a scanning manner while the substrate 2 is moved relative to the organic layer deposition apparatus, and thus, it is not easy to prevent the organic material from being deposited on the non-film-forming region of the substrate 2.

Therefore, to prevent the organic material from being deposited on the non-film-forming region of the substrate 2, in the organic layer deposition apparatus, the shielding member 140 may be disposed on the edge portion of the substrate 2. Although not particularly illustrated in FIGS. 3 and 4, the shielding member 140 may include two adjacent plates.

When the substrate 2 does not pass through the organic layer deposition assembly 100-1, the shielding member 140 screens the deposition source 110, and thus, the deposition material 115 discharged from the deposition source 110 does not reach the patterning slit sheet 130. When the substrate 2 enters into the organic layer deposition assembly 100-1 with the shielding member 140 screening the deposition source 110, a front part of the shielding member 140 which screens the deposition source 110 moves along with the movement of the substrate 2, and thus, the flow path of the deposition material 115 is opened and the deposition material 115 discharged from the deposition source 110 passes through the patterning slit sheet 130 and is deposited on the substrate 2. Also, while the substrate 2 is passing through the organic layer deposition assembly 100-1, a rear part of the shielding member 140 moves along with the movement of the substrate 2 to screen the deposition source 110 so that the flow path of the deposition material 115 is closed. Accordingly, the deposition material 115 discharged from the deposition source 110 does not reach the patterning slit sheet 130.

As described above, the non-film-forming region of the substrate 2 is screened by the shielding member 140, and thus, it may be easy to prevent the organic material from being deposited on the non-film-forming region of the substrate 2 without using a separate structure.

Hereinafter, the conveyer unit 400 that conveys the substrate 2, on which the deposition material 115 is to be deposited, is described in more detail. Referring to FIGS. 3, 4, 7, and 8, the conveyer unit 400 includes the first conveyer unit 410, the second conveyer unit 420, and the transfer unit 430.

The first conveyer unit 410 conveys in an in-line manner the transfer unit 430, including the carrier 431 and an electrostatic chuck 432 attached thereto, and the substrate 2 attached to the transfer unit 430 so that an organic layer may be formed on the substrate 2 by the organic layer deposition assembly 100-1. The first conveyer unit 410 includes a coil 411, guide members 412, upper magnetically suspended bearings 413, side magnetically suspended bearings 414, and gap sensors 415 and 416.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed along the first conveyer unit 410 and the second conveyer unit 420 and the electrostatic chuck 432 that is combined on a surface of the carrier 431 and to which the substrate 2 is attached.

Hereinafter, each element of the conveyer unit 400 will be described in more detail.

The carrier 431 of the transfer unit 430 will now be described in detail.

Referring to FIG. 7, the carrier 431 includes a main body part 431a, a magnetic rail 431b, contactless power supply (CPS) modules 431c, a power supply unit 431d, and guide grooves 431e. The carrier 431 may further include cam followers 431f (refer to FIG. 8).

The main body part 431a constitutes a base part of the carrier 431 and may be formed of a magnetic material such as iron. In this regard, due to a repulsive force between the main body part 431a and the respective upper and side magnetically suspended bearings 413 and 414, which are described below, the carrier 431 may be maintained spaced apart from the guide members 412 by a certain distance.

The guide grooves 431e may be respectively formed at both sides of the main body part 431a and each may accommodate a guide protrusion 412e of the guide member 412.

The magnetic rail 431b may be formed along a center line of the main body part 431a in a direction where the main body part 431a proceeds. The LMS magnet 431b and the coil 411, which are described below in more detail, may be combined with each other to constitute a linear motor, and the carrier 431 may be conveyed in an arrow A direction by the linear motor.

The CPS modules 431c and the power supply unit 431d may be respectively formed on both sides of the LMS magnet 431b in the main body part 431a. The power supply unit 431d includes a battery (e.g., a rechargeable battery) that provides power so that the electrostatic chuck 432 can chuck the substrate 2 and maintains operation. The CPS modules 431c are wireless charging modules that charge the power supply unit 431d. In particular, the charging track 423 formed in the second conveyer unit 420, which are described below, is connected to an inverter (not shown), and thus, when the carrier 431 is transferred into the second conveyer unit 420, a magnetic field is formed between the charging track 423 and the CPS modules 431c so as to supply power to the CPS module 431c. The power supplied to the CPS modules 431c is used to charge the power supply unit 431d.

The electrostatic chuck 432 may include an electrode embedded in a main body formed of ceramic, wherein the electrode is supplied with power. The substrate 2 is attached onto a surface of the main body of the electrostatic chuck 432 as a high voltage is applied to the electrode.

Hereinafter, the first conveyer unit 410 and the transfer unit 430 are described in detail.

Referring to FIGS. 4 and 8, the first conveyer unit 410 conveys the electrostatic chuck 432 that fixes the substrate 2 and conveys the carrier 431 that conveys the electrostatic chuck 432. In this regard, the first conveyer unit 410 includes the coil 411, the guide members 412, the upper magnetically suspended bearings 413, the side magnetically suspended bearings 414, and the gap sensors 415 and 416.

The coil 411 and the guide members 412 are formed inside the upper housing 104. The coil 411 is formed in an upper portion of the upper housing 104, and the guide members 421 are respectively formed on both inner sides of the upper housing 104. The coil 411 is described below with reference to FIG. 9.

The guide members 412 guide the carrier 431 to move in a direction. In this regard, the guide members 412 are formed to pass through the deposition unit 100.

In particular, the guide members 412 accommodate both sides of the carrier 431 to guide the carrier 431 to move along in the direction of arrow A illustrated in FIG. 3. In this regard, the guide member 412 may include a first accommodation part 412*a* disposed below the carrier 431, a second accommodation part 412*b* disposed above the carrier 431, and a connection part 412*c* that connects the first accommodation part 412*a* and the second accommodation part 412*b*. An accommodation groove 412*d* is formed by the first accommodation part 412*a*, the second accommodation part 412*b*, and the connection part 412*c*. Both sides of the carrier 431 are respectively accommodated in the accommodation grooves 412*d*, and the carrier 431 is moved along the accommodation grooves 412*d*.

The side magnetically suspended bearings 414 are each disposed in the connection part 412*c* of the guide member 412 so as to respectively correspond to both sides of the carrier 431. The side magnetically suspended bearings 414 cause a distance between the carrier 431 and the guide member 412 so that the carrier 431 is moved along the guide members 412 in non-contact with the guide members 412. That is, a repulsive force R1 occurring between the side magnetically suspended bearing 414 on the left side in FIG. 8 and the carrier 431, which is a magnetic material, and a repulsive force R2 occurring between the side magnetically suspended bearing 414 on the right side in FIG. 8 and the carrier 431, which is a magnetic material, maintain equilibrium, and thus, there is a constant distance between the carrier 431 and the respective parts of the guide member 412.

Each upper magnetically suspended bearing 413 may be disposed in the second accommodation part 412*b* so as to be above the carrier 431. The upper magnetically suspended bearings 413 enable the carrier 431 to be moved along the guide members 412 in non-contact with the first and second accommodation parts 412*a* and 412*b* and with a distance therebetween maintained constant. That is, a repulsive force R3 occurring between the upper magnetically suspended bearing 413 and the carrier 431, which is a magnetic material, and gravity G maintain equilibrium, and thus, there is a constant distance between the carrier 431 and the respective guide members 412.

Each guide member 412 may further include the gap sensor 415. The gap sensor 415 may measure a distance between the carrier 431 and the guide member 412. Referring to FIG. 8, the gap sensor 415 may be disposed in the first accommodation part 412*a* so as to correspond to a bottom portion of the carrier 431. The gap sensor 415 disposed in the first accommodation part 412*a* may measure a distance between the first accommodation part 412*a* and the carrier 431. The gap sensor 416 may be disposed at a side of the side magnetically suspended bearing 414. The gap sensor 416 may measure a distance between a side surface of the carrier 431 and the side magnetically suspended bearing 414. The present invention is not limited to the above example, and the gap sensor 416 may be disposed in the connection part 412*c*.

Magnetic forces of the upper and side magnetically suspended bearings 413 and 414 may vary according to values measured by the gap sensors 415 and 146, and thus, distances between the carrier 431 and the respective guide members 412 may be adjusted in real time. That is, a precise transfer of the carrier 431 may be feedback controlled using the upper and side magnetically suspended bearings 413 and 414 and the gap sensors 415 and 416.

Hereinafter, an operation of the transfer unit 430 is described in more detail.

The LMS magnet 431*b* of the main body part 431*a* and the coil 411 may be combined with each other to constitute an operation unit. In this regard, the operation unit may be a linear motor. The linear motor has a small frictional coefficient, little position error, and a very high degree of position determination, as compared to a conventional slide guide system. As described above, the linear motor may include the coil 411 and the LMS magnet 431*b*. The LMS magnet 431*b* is linearly disposed on the carrier 431, and a plurality of the coils 411 may be disposed at an inner side of the chamber 101 by a certain distance so as to face the LMS magnet 431*b*. Since the LMS magnet 431*b* is disposed on the carrier 431 instead of the coil 411, the carrier 431 may be operable without power being supplied thereto.

In this regard, the coil 411 may be formed in an atmosphere (ATM) box. In particular, even though the linear motor generally has a very high degree of position determination as compared to a conventional slide guide system, it is difficult to use the linear motor in a vacuum environment due to the outgassing of the coil. In a conveying system employed in the organic layer deposition apparatus according to the present embodiment, however, the LMS magnet 431*b* and the coil 411 may be operated by being spaced apart from each other by a distance of approximately 5 mm, and thus, the coil 411 is included in the ATM box in an air atmosphere and the carrier 431 to which the LMS magnet 431*b* is attached may be moved in the chamber 101 maintained in vacuum. This will now be described in more detail.

Figure 9:
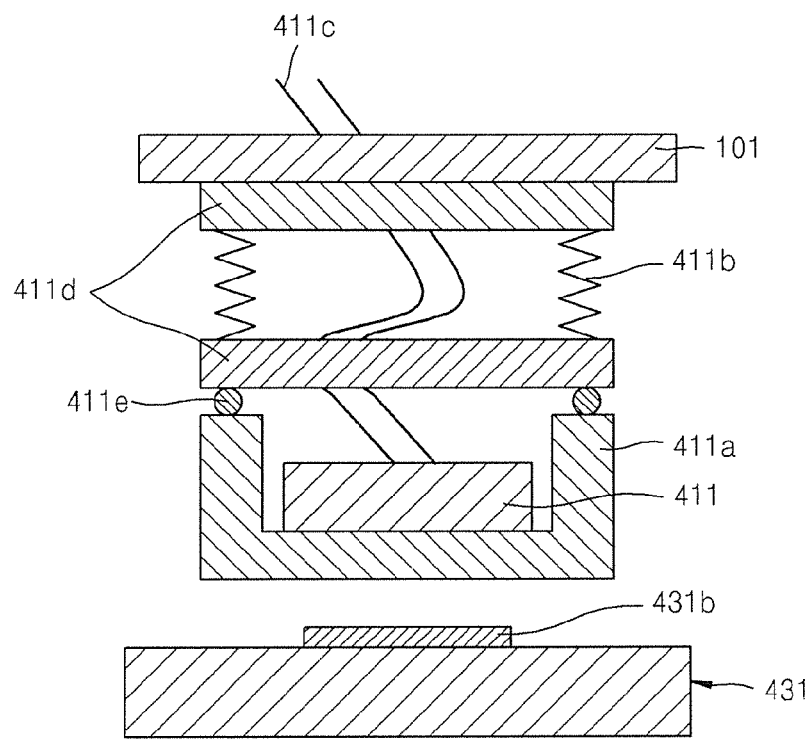
FIG. 9 is a diagram illustrating a structure in which coils of the deposition unit of FIG. 3 are formed in an atmosphere (ATM) box, according to an embodiment of the present invention.

FIG. 9 is a diagram illustrating a structure in which the coil 411 of FIG. 3 is formed in an ATM box. Referring to FIG. 9, the coil 411 is accommodated in an ATM box 411*a*. A hall is formed in the chamber 101 to correspond to the coil 411, and thus, the coil 411 is opened to the outside. Bellows 411*b* are formed to surround the hall, and the bellows 411*b* and the ATM box 411*a* are connected to each other. In this regard, the bellows 411*b*, which indicate a pleated tube, is formed to be flexible by the pleats. Thus, the coil 411 accommodated in the ATM box 411*a* may be maintained in an air atmosphere, and the inside of the chamber 101 may be maintained in a vacuum state. A cable 411*c* may be connected to the coil 411 in the air atmosphere, and thus, power may be applied to the coil 411 from an external device. Reinforcing plates 411*d* may be disposed on upper and lower sides of the bellows 411*b* so as to stably connect the chamber 101 and the ATM box 411*a*. In addition, a sealing member 411*e*, such as O-rings, may be disposed between the bellows 411*b* and the ATM box 411*a*, and thus, vacuum reliability inside the chamber 101 may be improved.

Since the ATM box 411*a* is connected to the chamber 101 by, the bellows 411*b*, the ATM box 411*a* and the coil 411 accommodated therein may be maintained in a fixed position even though the chamber 101 is repeatedly contracted and expanded, and thus, a distance between the coil 411 and the LMS magnet 431*b* may be maintained constant. In addition, since the coil 411 accommodated in the ATM box 411*a* is maintained in an air atmosphere, the linear motor may be used regardless of problems such as outgassing.

Hereinafter, the second conveyer unit 420 and the transfer unit 430 are described in detail.

Referring back to FIG. 4, the second conveyer unit 420 returns the electrostatic chuck 432 from which the substrate 2 has been separated in the unloading unit 300 and the carrier 431 that carries the electrostatic chuck 432 to the loading unit 200. In this regard, the second conveyer unit 420 includes the coil 421, the roller guides 422, and the charging track 423.

In particular, the coil 421, the roller guides 422, and the charging track 423 may be positioned inside the lower housing 103. The coil 421 and the charging track 423 may be disposed on a top inner surface of the lower housing 103, and the roller guides 422 may be disposed on both inner sides of the lower housing 103. Although not illustrated in FIG. 4, the coil 421 may be disposed in an ATM box, as the coil 411 of the first conveyer unit 410.

Like the first conveyer unit 410, the second conveyer unit 410 may include the coil 421. Also, the LMS magnet 431b of the main body part 431a of the carrier 431 and the coil 421 are combined with each other to constitute an operation unit. In this regard, the operation unit may be a linear motor. The carrier 431 may be moved by the linear motor along a direction opposite to the direction of arrow A illustrated in FIG. 3.

The roller guides 422 guide the carrier 431 to move in a direction. In this regard, the roller guides 422 are formed to pass through the deposition unit 100. In particular, the roller guides 422 support cam followers 431f (see FIG. 8), respectively formed on both sides of the carrier 431 to guide the carrier 431 to move along a direction opposite to the direction of arrow A illustrated in FIG. 3. That is, the carrier 431 is moved with the cam followers 431f disposed on both sides of the carrier 431 respectively rotating along the roller guides 422. In this regard, the cam followers 431f are utilized as bearings used to accurately repeat a particular operation. In an embodiment, a plurality of the cam followers 431f are formed on a side surface of the carrier 431 and serve as a wheel for conveying the carrier 431 in the second conveyer unit 420. A detailed description of the cam followers 431f is not provided herein.

The second conveyer unit 420 is used in a process of returning the carrier 431 from which the substrate 2 has been separated and not in a process of depositing an organic material on the substrate 2, and thus, position accuracy thereof is not needed as by the first conveyer unit 410. Therefore, magnetic suspension is applied to the first conveyer unit 410 that requires high position accuracy, thereby obtaining position accuracy, and a conventional roller method is applied to the second conveyer unit 420 that requires relatively low position accuracy, thereby reducing manufacturing costs and simplifying a structure of the organic layer deposition apparatus. Although not illustrated in FIG. 4, the magnetic suspension may also be applied to the second conveyer unit 420 as in the first conveyer unit 410.

The organic layer deposition assembly 100-1 of the organic layer deposition apparatus 1 according to the present embodiment may further include the camera 170 and the sensor 180 for an aligning process.

The camera 170 may align in real time a first alignment mark (not shown) formed in the frame 135 of the patterning slit sheet 130 and a second alignment mark (not shown) formed on the substrate 2. In this regard, the camera 170 is disposed to more accurately view in the chamber 101 maintained in vacuum during deposition. For this, the camera 170 may be installed in a camera accommodation unit 171 in an atmospheric state. That is, similarly to the coil 411 accommodated in the ATM box illustrated in FIG. 9, a hall is formed in the chamber 101 to correspond to the camera 170, and thus, the camera 170 is opened to the outside, and the camera accommodation unit 171 is formed to extend from the hall. Thus, the camera 170 may be installed in the camera accommodation unit 171 in an atmospheric state, and the inside of the chamber 101 may still be maintained in a vacuum state. Due to such a structure, even though the chamber 101 is repeatedly contracted and expanded, the camera accommodation unit 171 and the camera 170 accommodated therein may be maintained in a fixed position. Therefore, the camera 170 may view more accurately in the chamber 101 maintained in vacuum during deposition.

Since the substrate 2 and the patterning slit sheet 130 are spaced apart from each other by a certain distance, distances to the substrate 2 and the patterning slit sheet 130 that are disposed at different positions need to be both measured using the camera 170. For this operation, the organic layer deposition assembly 100-1 of the organic layer deposition apparatus 1 may include the sensor 180. In this regard, the sensor 180 may be a confocal sensor. The confocal sensor may scan an object to be measured by using laser beams that rotate at high speed by using a scanning mirror and measure a distance to the object by using fluorescent or reflected rays emitted by the laser beams. The confocal sensor may measure a distance by sensing a boundary interface between different media.

That is, the sensor 180, such as a confocal sensor, is disposed in the chamber 101 and positioned on the substrate 2. The confocal sensor may measure a distance to a top surface of the substrate 2 by sensing a boundary interface between the top surface of the substrate 2 and a space, and measure a distance to a bottom surface of the substrate 2 by sensing a boundary interface between the bottom surface of the substrate 2 and a space. In addition, the sensor 180 may measure a distance to a top surface of the patterning slit sheet 130 by sensing a boundary interface between a space and the patterning slit sheet 130. Consequently, the sensor 180 may obtain a distance between the substrate 2 and the patterning slit sheet 130 by measuring a distance to the bottom surface of the substrate 2 and a distance to the top surface of the patterning slit sheet 130.

Since a distance between the substrate 2 and the patterning slit sheet 130 is measurable in real time using the camera 170 and the sensor 180, the substrate 2 may be aligned with the patterning slit sheet 130 in real time, whereby position accuracy of a pattern may be significantly improved.

Hereinafter, a structure of an organic layer formed using the organic layer deposition apparatus 1 described above is described in more detail.

Figure 10:
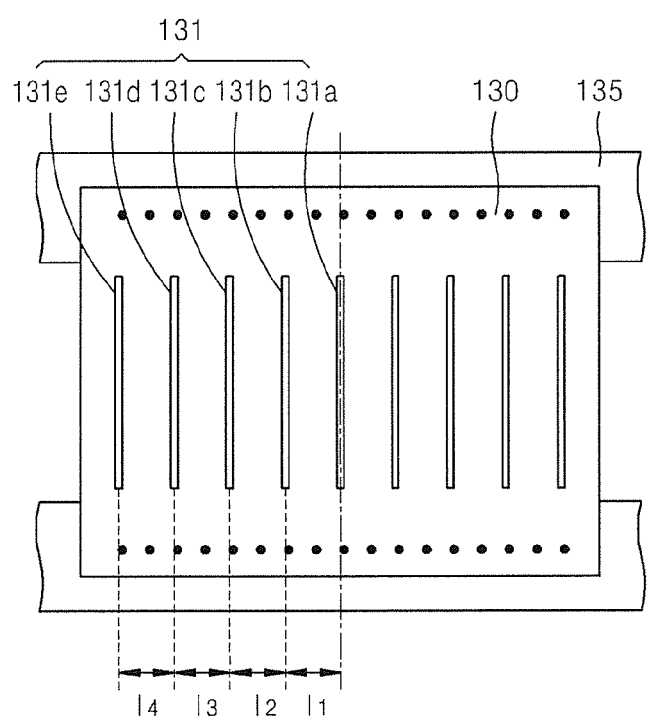
FIG. 10 is a diagram illustrating a structure in which patterning slits are arranged at equal intervals in a patterning slit sheet of the organic layer deposition apparatus including the deposition unit of FIG. 3, according to an embodiment of the present invention.
Figure 11:
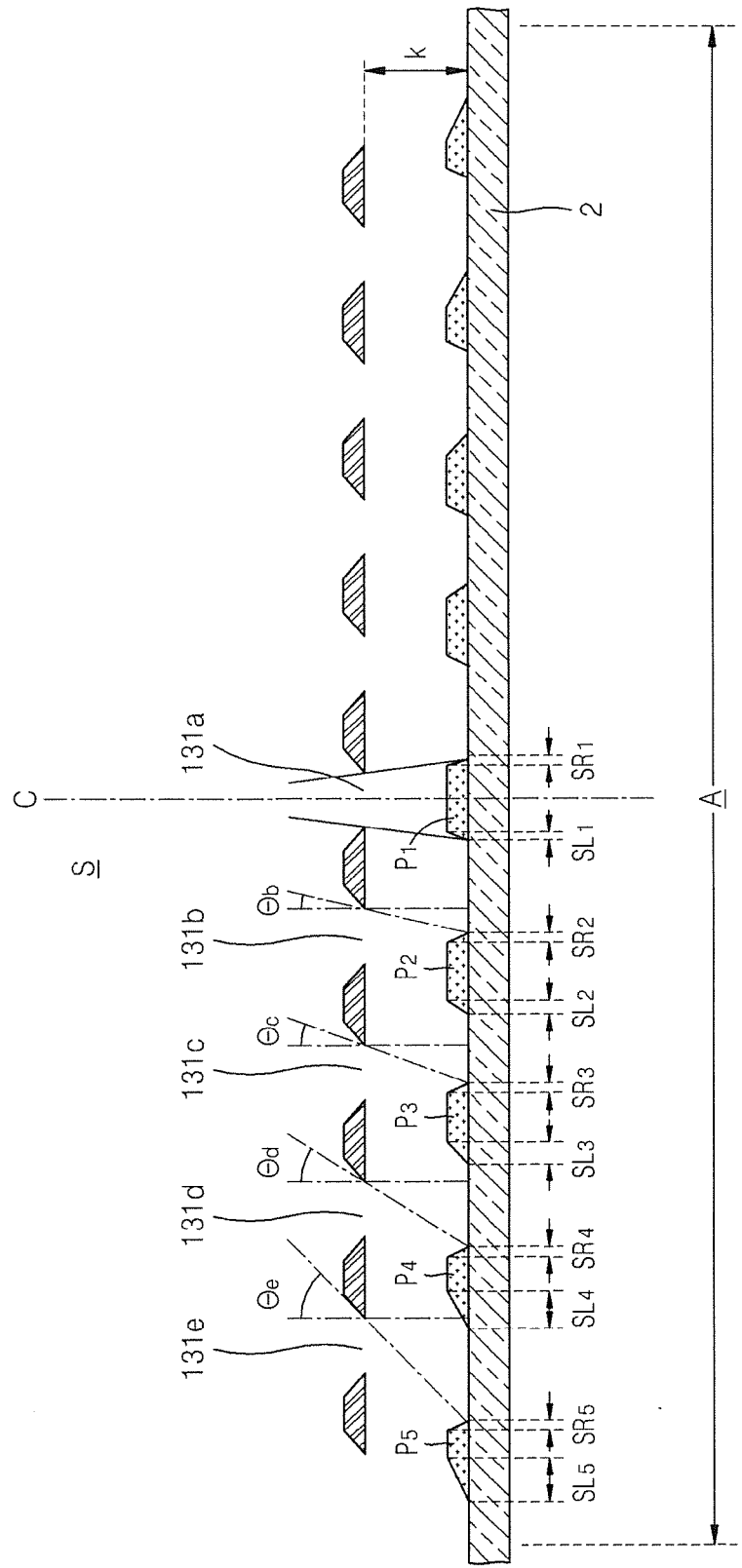
FIG. 11 is a diagram illustrating organic layers formed on a substrate by using the patterning slit sheet of FIG. 10, according to an embodiment of the present invention.

FIG. 10 is a diagram illustrating a structure in which the patterning slits 131 are arranged at equal intervals in the patterning slit sheet 130 of the organic layer deposition apparatus 1 including the deposition unit 100 of FIG. 3, according to an embodiment of the present invention. FIG. 11 is a diagram illustrating organic layers formed on the substrate 2 by using the patterning slit sheet 130 of FIG. 10, according to an embodiment of the present invention.

FIGS. 10 and 11 illustrate the patterning slit sheet 130 in which the patterning slits 131 are arranged at equal intervals. That is, in FIG. 10, the patterning slits 131 satisfy the following condition: $I_1 = I_2 = I_3 = I_4$.

In this embodiment, an incident angle of a deposition material discharged along a center line C of a deposition space S is substantially perpendicular to the substrate 2. Thus, an organic layer $P_1$ formed using the deposition material that has passed through a patterning slit 131a has a minimum size of a shadow, and a right-side shadow $SR_1$ and a left-side shadow $SL_1$ are formed symmetrical to each other.

However, a critical incident angle θ of the deposition material that passes through patterning slits disposed farther from the center line C of the deposition space S gradually increases, and thus, the critical incident angle θ of the deposition material that passes through the outermost patterning slit 131e is approximately 55°. Accordingly, the deposition material is incident at an inclination with respect to the patterning slit 131e, and an organic layer $P_5$ formed using the deposition material that has passed through the patterning slit 131e has the largest shadow. In particular, a left-side shadow $SR_5$ is larger than a right-side shadow $SR_5$.

That is, as the critical incident angle θ of the deposition material increases, the size of the shadow also increases. In particular, the size of the shadow at a position farther from the center line C of the deposition space S increases. In addition, the critical incident angle θ of the deposition material increases as a distance between the center line C of the deposition space S and the respective patterning slits increases. Thus, organic layers formed using the deposition material that passes through the patterning slits disposed farther from the center line C of the deposition space S have a larger shadow size. In particular, of the shadows on both sides of the respective organic layers, the size of the shadow at a position farther from the center line C of the deposition space S is larger than that of the other.

That is, referring to FIG. 11, the organic layers formed on the left side of the center line C of the deposition space S have a structure in which a left hypotenuse is larger than a right hypotenuse, and the organic layers formed on the right side of the center line C of the deposition space S have a structure in which a right hypotenuse is larger than a left hypotenuse.

Also, in the organic layers formed on the left side of the center line C of the deposition space S, the length of the left hypotenuse increases towards the left. In the organic layers formed on the right side of the center line C of the deposition space S, the length of the right hypotenuse increases towards the right. Consequently, the organic layers formed in the deposition space S may be formed symmetrical to each other about the center line C of the deposition space S.

This structure will now be described in more detail.

The deposition material that passes through a patterning slit 131b passes through the patterning slit 131b at a critical incident angle of $\theta_b$, and an organic layer $P_2$ formed using the deposition material that has passed through the patterning slit 131b has a left-side shadow having a size of $SL_2$. Similarly, the deposition material that passes through a patterning slit 131c passes through the patterning slit 131c at a critical incident angle of $\theta_c$, and an organic layer $P_3$ formed using the deposition material that has passed through the patterning slit 131c has a left-side shadow having a size of $SL_3$. Similarly, the deposition material that passes through a patterning slit 131d passes through the patterning slit 131d at a critical incident angle of $\theta_d$, and an organic layer $P_4$ formed using the deposition material that has passed through the patterning slit 131d has a left-side shadow having a size of $SL_4$. Similarly, the deposition material that passes through the patterning slit 131e passes through the patterning slit 131e at a critical incident angle of $\theta_e$, and an organic layer $P_5$ formed using the deposition material that has passed through the patterning slit 131e has a left-side shadow having a size of $SL_5$.

In this regard, the critical incident angles satisfy the following condition: $\theta_b < \theta_c < \theta_d < \theta_e$, and thus, the sizes of the shadows of the organic layers also satisfy the following condition: $SL_1 < SL_2 < SL_3 < SL_4 < SL_5$.

Figure 12:
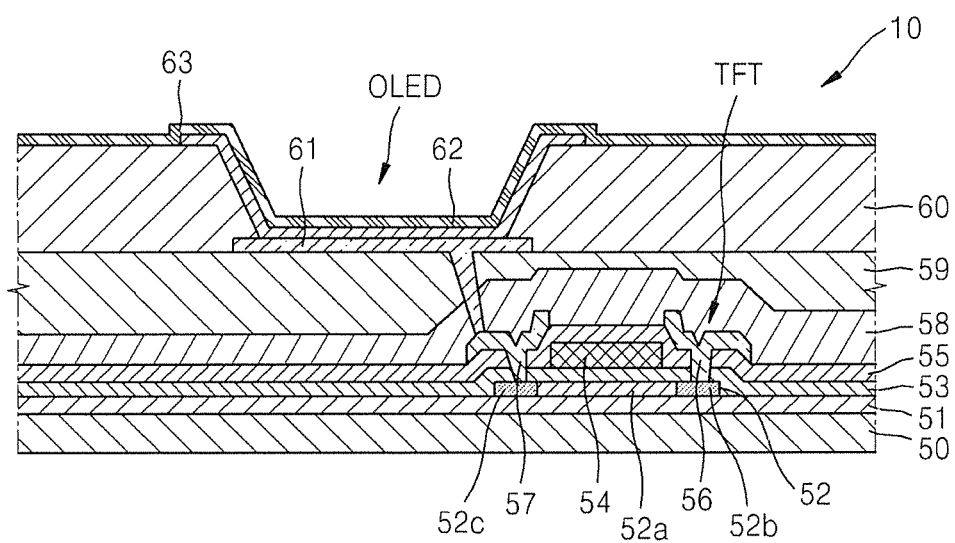
FIG. 12 is a cross-sectional view of an active matrix-type organic light-emitting display device manufactured using the organic layer deposition apparatus, according to an embodiment of the present invention.

FIG. 12 is a cross-sectional view of an active matrix-type organic light-emitting display device manufactured using the organic layer deposition apparatus 1, according to an embodiment of the present invention.

Referring to FIG. 12, the active matrix organic light-emitting display device 10 according to the current embodiment is formed on the substrate 50. The substrate 2 may be formed of a transparent material, for example, glass, plastic, or metal. An insulating layer 51, such as a buffer layer, is formed on an entire surface of the substrate 2.

A thin film transistor (TFT) 40, a capacitor 50, and an organic light-emitting diode (OLED) 60 are disposed on the insulating layer 31, as illustrated in FIG. 12.

A semiconductor active layer 41 is formed on an upper surface of the insulating layer 31 in a set or predetermined pattern. A gate insulating layer 32 is formed to cover the semiconductor active layer 41. The semiconductor active layer 41 may include a p-type or n-type semiconductor material.

A gate electrode 42 of the TFT 40 is formed in a region of the gate insulating layer 32 corresponding to the semiconductor active layer 41. An interlayer insulating layer 33 is formed to cover the gate electrode 42. The interlayer insulating layer 33 and the gate insulating layer 32 are etched by, for example, dry etching, to form a contact hole exposing parts of the semiconductor active layer 41.

Source/drain electrodes 43 are formed on the interlayer insulating layer 33 to contact the semiconductor active layer 41 through the contact hole. A passivation layer 34 is formed to cover the source/drain electrodes 43, and is etched to expose a part of one of the source/drain electrodes 43. An insulating layer (not shown) may be further formed on the passivation layer 34 so as to planarize the passivation layer 34.

In addition, the OLED 60 displays set or predetermined image information by emitting red, green, or blue light according to current. The OLED 60 includes a first electrode 61 disposed on the passivation layer 34. The first electrode 61 is electrically connected to the exposed source/drain electrode 43 of the TFT 40.

A pixel-defining layer 35 is formed to cover the first electrode 61. An opening is formed in the pixel-defining layer 35, and an organic layer 63 including an emission layer (EML) is formed in a region defined by the opening. A second electrode 62 is formed on the organic layer 63.

The pixel-defining layer 35, which defines individual pixels, is formed of an organic material. The pixel-defining layer 35 also planarizes the surface of a region of the substrate 30 in which the first electrode 61 is formed, and in particular, the surface of the passivation layer 34.

The first electrode 61 and the second electrode 62 are insulated from each other, and respectively apply voltages of opposite polarities to the organic layer 63 to induce light emission.

The organic layer 63, including an EML, may be formed of a low-molecular weight organic material or a high-molecular weight organic material. When a low-molecular weight organic material is used, the organic layer 63 may have a single or multi-layer structure including a hole injection layer (HIL), a hole transport layer (HTL), the EML, an electron transport layer (ETL), and/or an electron injection layer (EIL). Non-limiting examples of available organic materials may include copper phthalocyanine (CuPc), N,N'-di(naphthalene-1-yl)-N,N'-diphenyl-benzidine (NPB), and tris-8-hydroxyquinoline aluminum ($Alq_3$).

The organic layer 63 including an EML may be formed using the organic layer deposition apparatus 1 illustrated in FIGS. 1 through 10. That is, an organic layer deposition apparatus including a deposition source that discharges a deposition material, a deposition source nozzle unit that is disposed at a side of the deposition source and includes a plurality of deposition source nozzles formed therein, and a patterning slit sheet that faces the deposition source nozzle unit and includes a plurality of patterning slits formed therein is disposed spaced apart by a set or predetermined distance from a substrate on which the deposition material is to be deposited. In addition, the deposition material discharged from the organic layer deposition apparatus 1 (refer to FIG. 1)

is deposited on the substrate 2 (refer to FIG. 1) while the organic layer deposition apparatus 1 and the substrate 2 are moved relative to each other.

After the organic layer 63 is formed, the second electrode 62 may be formed by the same deposition method as used to form the organic layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 is used as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 63 and forming an auxiliary electrode layer or a bus electrode line thereon from ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a compound thereof on the entire surface of the organic layer 63. The second electrode 62 may be formed using the same deposition method as used to form the organic layer 63 described above.

The organic layer deposition apparatuses according to the embodiments of the present invention described above may be applied to form an organic layer or an inorganic layer of an organic TFT, and to form layers from various materials.

As described above, the one or more embodiments of the present invention provide organic layer deposition apparatuses that are suitable for use in the mass production of a large substrate and enable high-definition patterning, methods of manufacturing organic light-emitting display devices by using the same, and organic light-emitting display devices manufactured using the methods.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light-emitting display device by using an organic layer deposition apparatus for forming an organic layer on a substrate, the method comprising:

fixing the substrate on a transfer unit in a loading unit;

conveying, into a chamber, the transfer unit on which the substrate is fixed, by using a first conveyer unit installed to pass through the chamber;

forming an organic layer by depositing a deposition material discharged from an organic layer deposition assembly on the substrate while the substrate is moved relative to the organic layer deposition assembly with the organic layer deposition assembly comprising a patterning slit sheet in the chamber being spaced apart from the substrate by a predetermined distance, and the substrate or the patterning slit sheet being moved relative to each other during the depositing of the deposition material;

separating the substrate on which the depositing has been completed from the transfer unit in an unloading unit; and conveying the transfer unit from which the substrate is separated to the loading unit by using a second conveyer unit installed to pass through the chamber.

2. The method of claim 1, wherein the chamber comprises a plurality of the organic layer deposition assemblies, and wherein deposition is sequentially performed on the substrate by using each of the plurality of the organic layer deposition assemblies.

3. The method of claim 1, wherein the transfer unit is cyclically moved between the first conveyer unit and the second conveyer unit.

4. The method of claim 1, wherein the first conveyer unit and the second conveyer unit are respectively arranged above and below in parallel to each other.

5. The method of claim 1, wherein the transfer unit is transferred in the chamber in non-contact with the first conveyer unit.

6. The method of claim 1, wherein the organic layer deposition apparatus comprises a plurality of the organic layer deposition assemblies for discharging different deposition materials.

7. The method of claim 1, wherein the forming comprises concurrently depositing on the substrate respective deposition materials discharged from a plurality of the organic layer deposition assemblies.

8. The method of claim 1, wherein the organic layer deposition assembly comprises: a deposition source discharging a deposition material; a deposition source nozzle unit disposed at a side of the deposition source and comprises a plurality of deposition source nozzles; and the patterning slit sheet facing the deposition source nozzle unit and comprising a plurality of patterning slits arranged along a second direction perpendicular to a first direction, and wherein the deposition material discharged from the deposition source passes through the patterning slit sheet to be deposited on the substrate in a certain pattern.

9. The method of claim 8, wherein the patterning slit sheet of the organic layer deposition assembly is formed smaller than the substrate in at least any one of the first direction and the second direction perpendicular to the first direction.

10. The method of claim 1, wherein a deposition unit comprises a chamber maintained in a vacuum state and the organic layer deposition assembly, wherein a plurality of the deposition units are arranged in parallel to each other, wherein one patterning slit sheet replacement unit is disposed between two adjacent deposition units of the plurality of the deposition units, and wherein a patterning slit sheet of the two adjacent deposition units configured to be entered into and drawn out of the one patterning slit sheet replacement unit.

11. The method of claim 1, wherein a deposition unit comprises a chamber maintained in a vacuum state and the organic layer deposition assembly, and wherein the first conveyer unit is configured to sequentially convey the transfer unit into the loading unit, the deposition unit, and the unloading unit.

12. The method of claim 1, wherein a deposition unit comprises a chamber maintained in a vacuum state and the organic layer deposition assembly, and wherein the second conveyer unit is configured to sequentially convey the transfer unit into the unloading unit, the deposition unit, and the loading unit.

13. The method of claim 1, wherein the organic layer deposition assembly comprises: a deposition source for discharging a deposition material; a deposition source nozzle unit at a side of the deposition source and comprising a plurality of deposition source nozzles; and the patterning slit sheet facing the deposition source nozzle unit and comprising a plurality of patterning slits arranged along a direction, and wherein the deposition source is configured to discharge the deposition material to pass through the patterning slit sheet to be deposited on the substrate in a certain pattern.

14. The method of claim 13, wherein the patterning slit sheet of the organic layer deposition assembly is formed smaller than the substrate in at least any one of a first direction and a second direction perpendicular to the first direction.

15. The method of claim 13, wherein the organic layer deposition apparatus comprises a plurality of the organic layer deposition assemblies, and wherein respective deposition sources of the plurality of the organic layer deposition assemblies comprise different deposition materials.

16. The method of claim 13, wherein while the substrate is being moved relative to the organic layer deposition apparatus, respective deposition materials of the organic layer deposition assembly are sequentially deposited on the substrate.

17. The method of claim 13, wherein the organic layer deposition apparatus and the substrate are moved relative to each other along a surface parallel to a surface of the substrate on which the deposition material is deposited.

18. The method of claim 13, wherein the chamber further comprises an upper housing for accommodating the first conveyer unit and the organic layer deposition assembly and a lower housing for accommodating the second conveyer unit.

19. The method of claim 13, further comprising a shielding member disposed between the deposition source and the patterning slit sheet, wherein the shielding member is configured to move along with the substrate so as to screen at least a portion of the substrate.

20. The method of claim 19, wherein the shielding member is formed to screen a non-film-forming region of the substrate.

21. The method of claim 13, wherein the patterning slit sheet comprises a first alignment mark, the substrate comprises a second alignment mark, and the deposition unit further comprises a camera configured to photograph the first alignment mark and the second alignment mark to detect a relative position of the substrate to the patterning slit sheet.

22. The method of claim 13, wherein the deposition unit further comprises a sensor for measuring a distance between the substrate and the patterning slit sheet, and wherein the sensor is on the substrate and configured to sense a surface of the substrate and a surface of the patterning slit sheet so as to measure a distance between the substrate and the patterning slit sheet.

23. The method of claim 22, wherein the sensor is a confocal sensor.

24. The method of claim 1, wherein the first conveyer unit and the second conveyer unit are vertically arranged in parallel to each other.

25. A method of manufacturing an organic light-emitting display device by using an organic layer deposition apparatus for forming an organic layer on a substrate, the method comprising:
fixing the substrate on a transfer unit in a loading unit;
conveying, into a chamber, the transfer unit on which the substrate is fixed, by using a first conveyer unit installed to pass through the chamber;
forming an organic layer by depositing a deposition material discharged from an organic layer deposition assembly on the substrate while the substrate is moved relative to the organic layer deposition assembly with the organic layer deposition assembly in the chamber being spaced apart from the substrate by a predetermined distance;
separating the substrate on which the depositing has been completed from the transfer unit in an unloading unit; and
conveying the transfer unit from which the substrate is separated to the loading unit by using a second conveyer unit installed to pass through the chamber,
wherein the organic layer deposition assembly comprises:
a deposition source for discharging a deposition material;
a deposition source nozzle unit at a side of the deposition source and comprising a plurality of deposition source nozzles; and
a patterning slit sheet facing the deposition source nozzle unit and comprising a plurality of patterning slits arranged along a direction, and wherein the deposition source is configured to discharge the deposition material to pass through the patterning slit sheet to be deposited on the substrate in a certain pattern, and
wherein the transfer unit comprises a carrier configured to be moved by the first conveyer unit and the second conveyer unit and an electrostatic chuck fixedly combined to the carrier to fix the substrate.

26. The method of claim 25, wherein a magnetic rail is on a surface of the carrier, each of the first conveyer unit and the second conveyer unit comprises a plurality of coils, wherein the magnetic rail and the plurality of coils are combined together to constitute an operation unit for generating a driving force to move the transfer unit.

27. The method of claim 26, wherein the first conveyer unit comprises guide members each comprising an accommodation groove, wherein the respective accommodation grooves are configured to accommodate both sides of the transfer unit, to guide the transfer unit to move in a first direction; and a magnetically suspended bearing is configured to suspend the transfer unit from the accommodation grooves so as to move the transfer unit in non-contact with the accommodation grooves.

28. The method of claim 27, wherein the magnetically suspended bearing comprises side magnetically suspended bearings arranged on both side surfaces of the carrier and upper magnetically suspended bearings arranged above the carrier.

29. The method of claim 27, wherein the first conveyer unit further comprises a gap sensor for measuring a distance between the guide member and the carrier.

30. The method of claim 26, wherein the plurality of coils are formed in an atmosphere (ATM) box.

31. The method of claim 30, wherein the ATM box is connected to the chamber by bellows.

32. The method of claim 26, wherein a cam follower is disposed on both side surfaces of the carrier, the second conveyer unit comprises a roller guide to support the cam follower, wherein the cam follower of the carrier is configured to be moved along the roller guide.

33. The method of claim 25, wherein a contactless power supply (CPS) module in the carrier and a charging track is in a portion of the second conveyer unit which corresponds to the CPS module, wherein when the carrier is transferred in the second conveyer unit, a magnetic field is formed between the charging track and the CPS module so as to supply power to the CPS module in a non-contact manner.

34. A method of manufacturing an organic light-emitting display device by using an organic layer deposition apparatus for forming an organic layer on a substrate, the method comprising:

fixing the substrate on a transfer unit in a loading unit;

conveying, into a chamber, the transfer unit on which the substrate is fixed, by using a first conveyer unit installed to pass through the chamber;

forming an organic layer by depositing a deposition material discharged from an organic layer deposition assembly on the substrate while the substrate is moved relative to the organic layer deposition assembly with the organic layer deposition assembly in the chamber being spaced apart from the substrate by a predetermined distance;

separating the substrate on which the depositing has been completed from the transfer unit in an unloading unit; and conveying the transfer unit from which the substrate is separated to the loading unit by using a second conveyer unit installed to pass through the chamber, wherein the organic layer deposition assembly comprises:

a deposition source for discharging a deposition material;

a deposition source nozzle unit at a side of the deposition source and comprising a plurality of deposition source nozzles; and a patterning slit sheet facing the deposition source nozzle unit and comprising a plurality of patterning slits arranged along a direction, and wherein the deposition source is configured to discharge the deposition material to pass through the patterning slit sheet to be deposited on the substrate in a certain pattern, wherein the chamber further comprises an upper housing for accommodating the first conveyer unit and the organic layer deposition assembly and a lower housing for accommodating the second conveyer unit, and wherein the deposition source and a deposition source nozzle are formed in the upper housing, and wherein a first stage for transferring the patterning slit sheet in a first direction and a second direction perpendicular to the first direction, a second stage for transferring the patterning slit sheet in a third direction perpendicular to each of the first and second directions, and the patterning slit sheet are sequentially stacked on the deposition source and the deposition source nozzle.

35. The method of claim 34, wherein the patterning slit sheet and the substrate are configured to be aligned with each other by the movement of the first stage and the second stage.

\* \* \* \* \*